US009153548B2

(12) United States Patent
Chan et al.

(10) Patent No.: US 9,153,548 B2
(45) Date of Patent: Oct. 6, 2015

(54) ADHESIVE WAFER BONDING WITH SACRIFICIAL SPACERS FOR CONTROLLED THICKNESS VARIATION

(71) Applicant: LuxVue Technology Corporation, Santa Clara, CA (US)

(72) Inventors: Clayton Ka Tsun Chan, Fremont, CA (US); Andreas Bibl, Los Altos, CA (US)

(73) Assignee: Lux Vue Technology Corporation, Santa Clara, CA (US)

( * ) Notice: Subject to any disclaimer, the term of this patent is extended or adjusted under 35 U.S.C. 154(b) by 0 days.

(21) Appl. No.: 14/027,875

(22) Filed: Sep. 16, 2013

(65) Prior Publication Data

US 2015/0076528 A1    Mar. 19, 2015

(51) Int. Cl.
*H01L 27/15* (2006.01)
*H01L 23/00* (2006.01)
*H01L 25/075* (2006.01)
*H01L 33/00* (2010.01)

(52) U.S. Cl.
CPC ............ *H01L 24/00* (2013.01); *H01L 25/0753* (2013.01); *H01L 27/156* (2013.01); *H01L 33/0079* (2013.01)

(58) Field of Classification Search
None
See application file for complete search history.

(56) References Cited

U.S. PATENT DOCUMENTS

| | | |
|---|---|---|
| 3,717,743 A | 2/1973 | Costello |
| 3,935,986 A | 2/1976 | Lattari et al. |
| 5,131,582 A | 7/1992 | Kaplan et al. |
| 5,378,926 A | 1/1995 | Chi et al. |
| 5,435,857 A | 7/1995 | Han et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,130,445 A | 10/2000 | Wang et al. |
| 6,319,778 B1 | 11/2001 | Chen et al. |
| 6,335,263 B1 | 1/2002 | Cheung et al. |

(Continued)

FOREIGN PATENT DOCUMENTS

| | | |
|---|---|---|
| JP | 07-060675 A | 3/1995 |
| JP | 11-142878 A | 5/1999 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Johyannes P Mondt
(74) *Attorney, Agent, or Firm* — Blakely, Sokoloff, Taylor & Zafman LLP

(57) ABSTRACT

A method and structure for forming an array of micro devices is disclosed. An array of micro devices is formed over an array of stabilization posts included in a stabilization layer. Patterned sacrificial spacers are formed between the stabilization posts and between the micro devices. The patterned sacrificial spacers are disposed upon the patterned sacrificial spacers.

19 Claims, 19 Drawing Sheets

(56) References Cited

U.S. PATENT DOCUMENTS

| | | |
|---|---|---|
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,586,875 B1 | 7/2003 | Chen et al. |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,762,069 B2 | 7/2004 | Huang et al. |
| 6,786,390 B2 | 9/2004 | Yang et al. |
| 6,878,607 B2 | 4/2005 | Inoue et al. |
| 6,918,530 B2 | 7/2005 | Shinkai et al. |
| 6,946,322 B2 | 9/2005 | Brewer |
| 7,015,513 B2 | 3/2006 | Hsieh |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,560,738 B2 | 7/2009 | Liu |
| 7,585,703 B2 | 9/2009 | Matsumura et al. |
| 7,622,367 B1 | 11/2009 | Nuzzo et al. |
| 7,628,309 B1 | 12/2009 | Erikssen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,953,134 B2 | 5/2011 | Chin et al. |
| 7,972,875 B2 | 7/2011 | Rogers et al. |
| 7,982,296 B2 | 7/2011 | Nuzzo et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,426,227 B1 | 4/2013 | Bibl et al. |
| 8,440,546 B2 | 5/2013 | Nuzzo et al. |
| 8,506,867 B2 | 8/2013 | Menard |
| 8,518,204 B2 | 8/2013 | Hu et al. |
| 8,624,968 B1 * | 1/2014 | Hersee et al. ............... 348/80 |
| 8,664,699 B2 | 3/2014 | Nuzzo et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 * | 7/2007 | Tran et al. ............... 438/22 |
| 2007/0194330 A1 | 8/2007 | Ibbetson et al. |
| 2007/0231943 A1 | 10/2007 | Ouellet et al. |
| 2008/0048206 A1 | 2/2008 | Lee et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2008/0315236 A1 | 12/2008 | Lu et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0078656 A1 * | 4/2010 | Seo et al. ............... 257/88 |
| 2010/0105172 A1 | 4/2010 | Li et al. |
| 2010/0123164 A1 | 5/2010 | Suehiro et al. |
| 2010/0171094 A1 | 7/2010 | Lu et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0244077 A1 | 9/2010 | Yao |
| 2010/0248484 A1 | 9/2010 | Bower et al. |
| 2010/0276726 A1 | 11/2010 | Cho et al. |
| 2010/0317132 A1 | 12/2010 | Rogers et al. |
| 2011/0003410 A1 | 1/2011 | Tsay et al. |
| 2011/0049540 A1 | 3/2011 | Wang et al. |
| 2011/0089464 A1 * | 4/2011 | Lin et al. ............... 257/99 |
| 2011/0132655 A1 | 6/2011 | Horiguchi et al. |
| 2011/0132656 A1 | 6/2011 | Horiguchi et al. |
| 2011/0136324 A1 * | 6/2011 | Ashdown et al. ............... 438/464 |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0165707 A1 | 7/2011 | Lott et al. |
| 2011/0210357 A1 | 9/2011 | Kaiser et al. |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0064642 A1 | 3/2012 | Huang et al. |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0128585 A1 | 5/2013 | Bibl et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2014/0373898 A1 | 12/2014 | Rogers et al. |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2011-181834 A | 9/2011 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/123285 | 10/2011 |

(56) References Cited

FOREIGN PATENT DOCUMENTS

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. Of ASID '06, 8-12, Oct., New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Overstolz, et al., "A Clean Wafer-Scale Chip-Release Process without Dicing Based on Vapor Phase Etching," Presented at the 17th IEEE International Conference on Micro Electro Mechanical Systems, Jan. 25-29, 2004, Maaastricht, The Netherlands. Published in the Technical Digest, ISBN 0-7803-8265-X, pp. 717-720, 4 pgs.

"Cyclotene Advanced Electronic Resins—Processing Procedures for BCB Adhesion," The Dow Chemical Company, Revised Jun. 2007, pp. 1-10.

Niklaus, et al., "Low-temperature full wafer adhesive bonding," Institute of Physics Bonding, Journal of Micromechanics and Microengineering, vol. 11, 2001, pp. 100-107.

Wohrmann, et al., "Low Temperature Cure of BCB and the Influence on the Mechanical Stress," 2011 Electronic Components and Technology Conference, pp. 392-400.

U.S. Appl. No. 13/952,450, filed Jul. 26, 2013.

\* cited by examiner

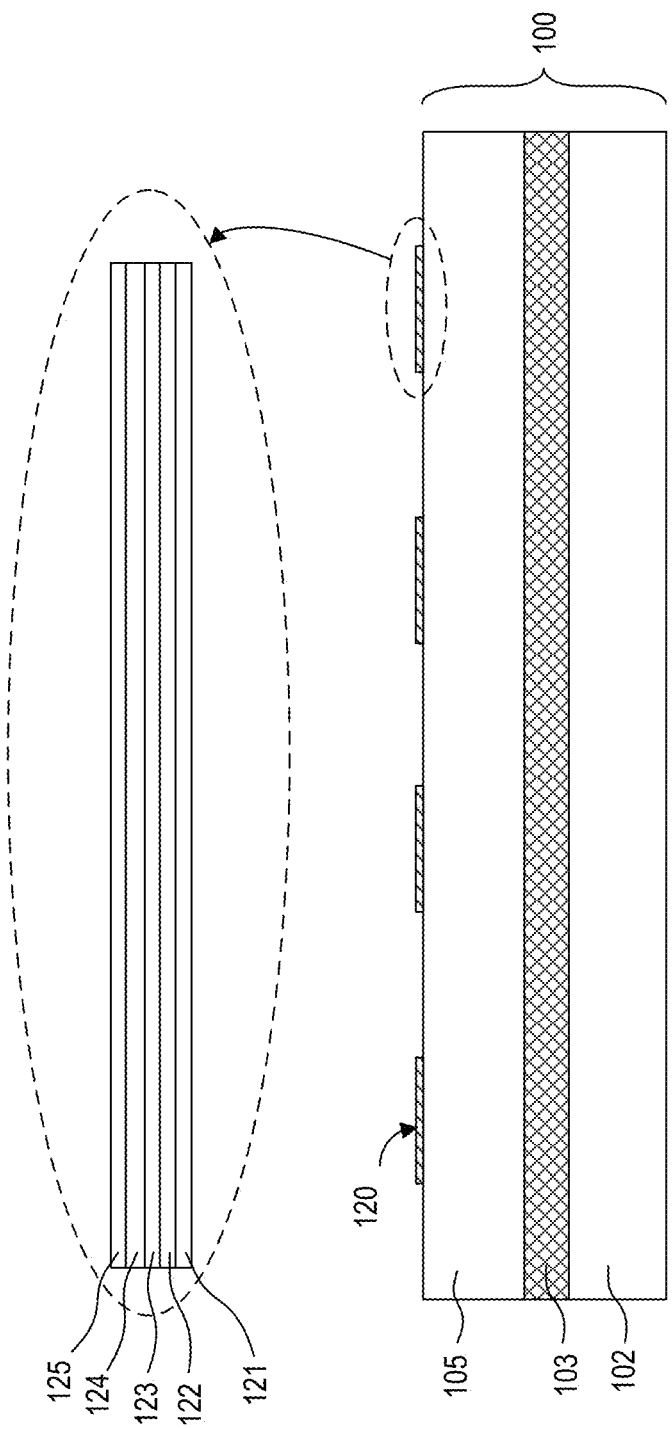

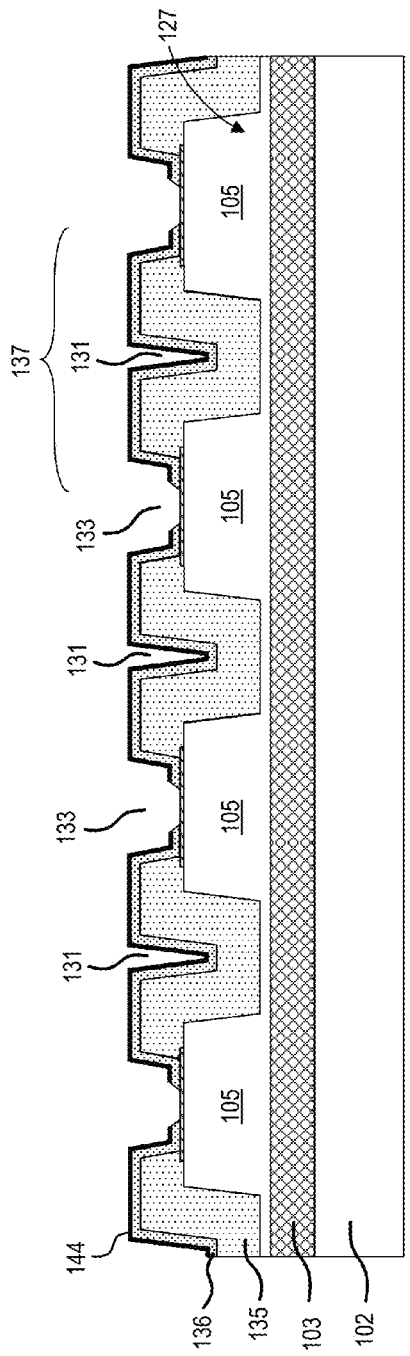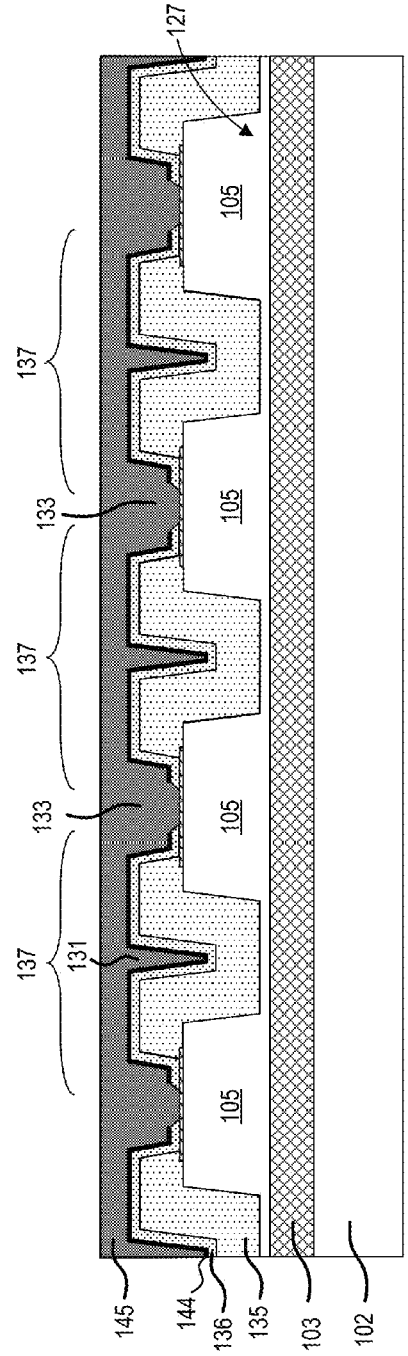

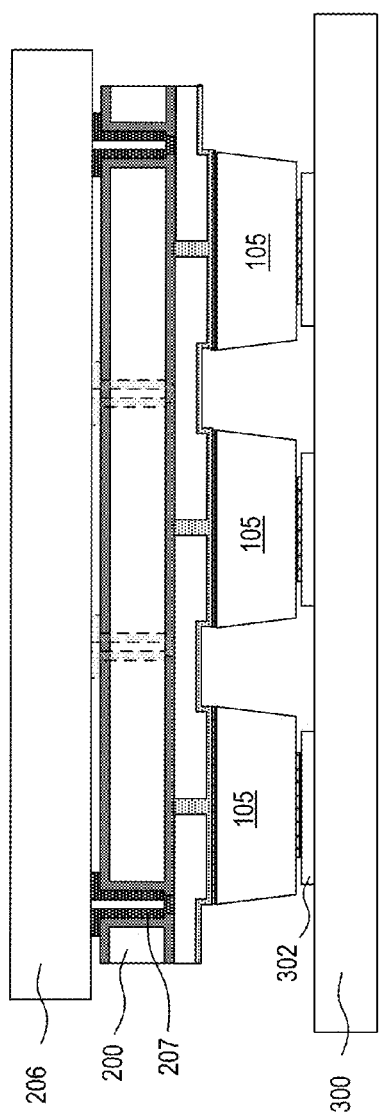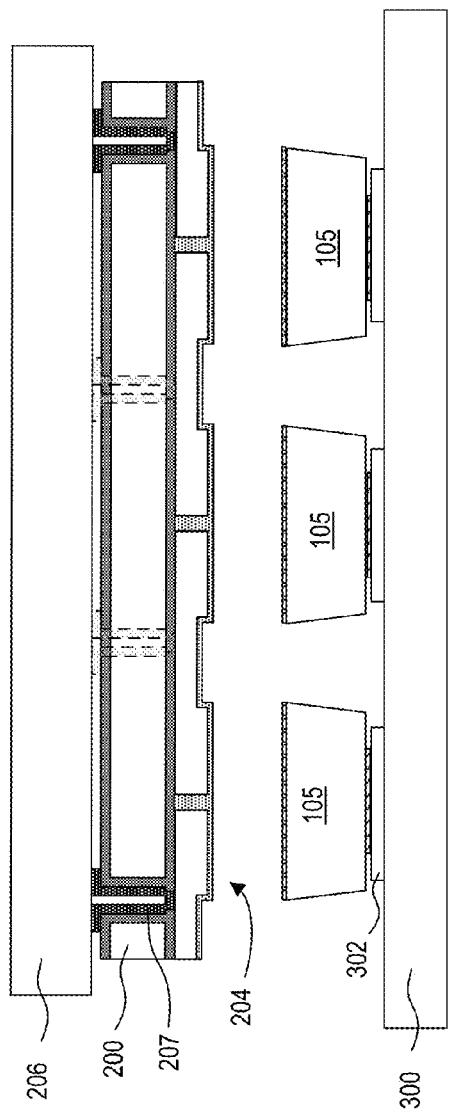

ADHESIVE WAFER BONDING WITH SACRIFICIAL SPACERS FOR CONTROLLED THICKNESS VARIATION

BACKGROUND

1. Field

The present invention relates to micro devices. More particularly, embodiments of the present invention relate to the stabilization of micro devices on a carrier substrate.

2. Background Information

Commercial manufacturing and packaging of micro devices often becomes more challenging as the scale of the micro devices decreases. Some examples of micro devices include radio frequency (RF), microelectromechanical systems (MEMS), microswitches, light-emitting diode (LED) display systems, and MEMS or quartz-based oscillators.

During fabrication of active devices, it is common bond two wafers or substrates. For example, a growth substrate may be bonded with a carrier substrate to position the device structure on a different wafer or substrate in order to perform processing operations on an alternate side of the micro device structure. The growth substrate may also be bonded with a carrier substrate because the carrier substrate is better suited to continue on in the fabrication process.

To bond one substrate/wafer to another, an adhesive bonding material may be applied as an adhesive layer between the two substrates. A wafer bonding fixture may be used to facilitate the process. The wafer bonding fixture may assist on exerting a controlled amount of pressure on the two wafers to encourage a close and uniform bonding of the two wafers. In some instances, the wafers to be bonded have alignment marks to promote a uniform bonding distance between the two wafers. In addition, the wafer bonding fixture may include fixture spacers positioned around the circumference of the two wafers in order to determine a thickness of the adhesive bonding material, and consequently, the spacing between the two wafers.

SUMMARY OF THE INVENTION

A structure and method of forming an array of micro devices which are poised for pick up are disclosed. In an embodiment, a structure includes a stabilization layer including an array of stabilization posts and an array of micro devices over the array of stabilization posts. Patterned sacrificial spacers are between the stabilization posts and between the micro devices. The patterned sacrificial spacers are disposed upon a carrier substrate.

In an embodiment, the patterned sacrificial spacers include a fine sacrificial layer and a course sacrificial layer. Each stabilization post may include a stabilization post protrusion disposed above a stabilization post platform and the stabilization post platform may be disposed between the stabilization post protrusion and the carrier substrate. The stabilization post platform is wider than the stabilization post protrusion, in some embodiments. In an embodiment, the micro devices are micro LED devices. In some embodiments, each micro device in the array of micro devices includes a bottom surface that is wider than a corresponding stabilization post directly underneath the bottom surface. The stabilization posts may extend through a thickness of the patterned sacrificial spacers. In an embodiment, the patterned sacrificial spacers span along a side surface of at least a portion of the micro devices in the array of micro devices. An array of bottom conductive contacts may be disposed on bottom surfaces of the array of micro devices. The stabilization layer includes an array of stabilization cavities that include stabilization cavity sidewalls surrounding the stabilization posts, in some embodiments. The stabilization layer may be formed of a thermoset material. In an embodiment, the stabilization layer also includes truncated stabilization posts in contiguous portions of the stabilization layer that support additional micro devices and the stabilization posts are in non-contiguous portions of the stabilization layer. The stabilization posts in the array of stabilization posts may be separated by a pitch of 1 µm to 10 µm.

In an embodiment, a method of forming an array of micro devices includes patterning a device layer to form an array of micro device mesa structures over a handle substrate. A layer of patterned sacrificial spacers is formed that includes an array of openings between the patterned sacrificial spacers. The array of openings are formed over the corresponding array of micro device mesa structures. The method further includes forming a stabilization layer over the patterned sacrificial spacers and within the array of openings and bonding the stabilization layer to a carrier substrate. Bonding the stabilization layer to the carrier substrate includes bringing the patterned sacrificial spacers to rest upon the carrier substrate.

Forming the layer of patterned sacrificial spacers may include forming a fine sacrificial layer over a course sacrificial layer. A thickness of the fine sacrificial layer defines a height of an array of stabilization posts formed of the stabilization layer within the array of openings, in an embodiment. In an embodiment, each micro device mesa structure includes a p-doped layer, an n-doped layer, and a quantum well layer between the p-doped layer and the n-doped layer. The method may include forming an array of conductive contacts over the device layer and the array of openings between the patterned sacrificial spacers may be formed directly over the array of conductive contacts. In an embodiment, bonding the stabilization layer to the carrier substrate includes curing the stabilization layer. The stabilization layer can be formed of a thermoset material. In an embodiment, the method further includes removing the handle substrate after bonding the stabilization layer to the carrier substrate. The patterned sacrificial spacers are removed after removing the handle substrate, in an embodiment. The array of openings may be separated by a pitch of 1 µm to 10 µm. In an embodiment, the micro device mesa structures outnumber the patterned sacrificial spacers. In one embodiment of the method, patterning the device layer to form the array of micro device mesa structures leaves unremoved portions of the device layer between the array of micro device mesa structures and the unremoved portions of the device layer are removed to form an array of laterally separate micro LED devices after removing the handle substrate.

BRIEF DESCRIPTION OF THE DRAWINGS

FIG. 2A is a cross-sectional side view illustration of a patterned conductive contact layer on a bulk LED substrate in accordance with an embodiment of the invention.

FIG. 5 is a cross-sectional side view illustration of an adhesion promoter layer and a fine sacrificial layer for patterned sacrificial spacers formed over a course sacrificial layer in accordance with an embodiment of the invention.

FIG. 6 is a cross-sectional side view illustration of a stabilization layer formed over an adhesion promoter layer and a layer of patterned sacrificial spacers and within an array of openings between the patterned sacrificial spacers in accordance with an embodiment of the invention.

FIGS. 13A-13E are cross-sectional side view illustrations of an array of electrostatic transfer heads transferring micro devices from a carrier substrate to a receiving substrate in accordance with an embodiment of the invention.

DETAILED DESCRIPTION OF THE INVENTION

Figure 1A:
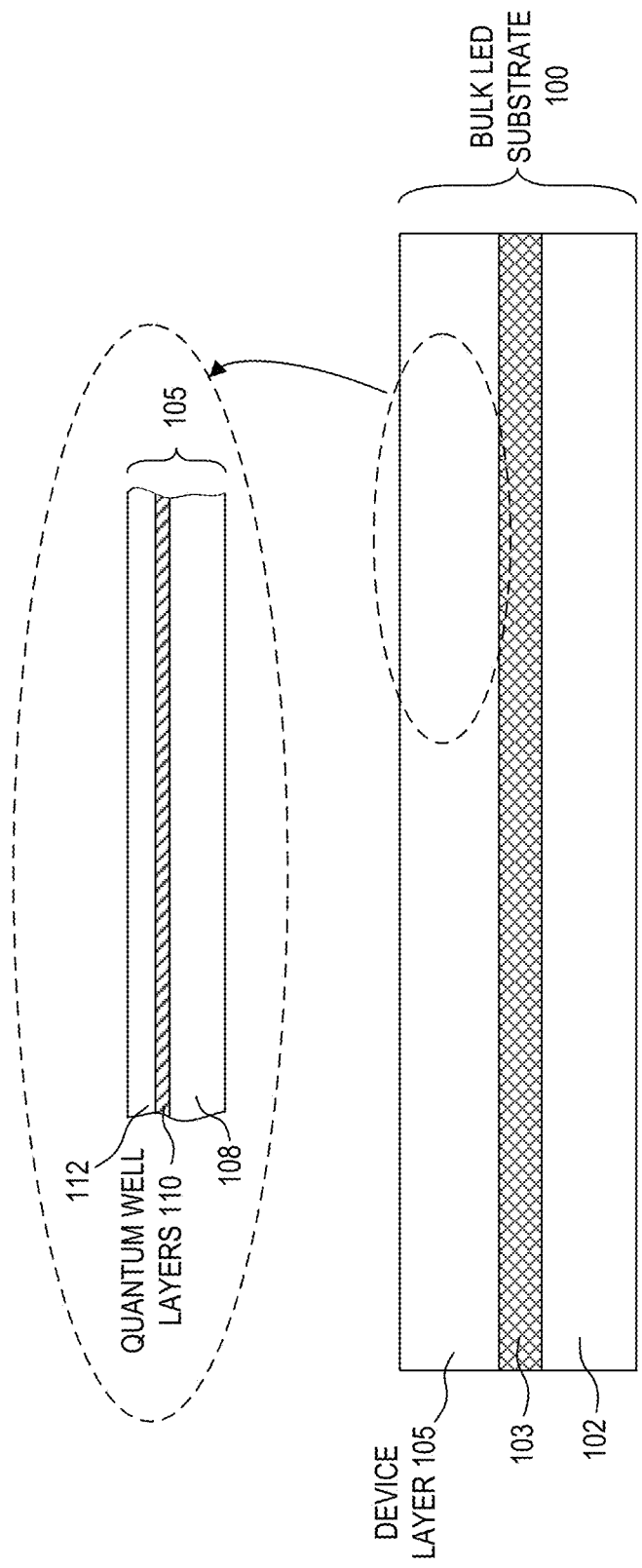
FIG. 1A is a cross-sectional side view illustration of a bulk LED substrate in accordance with an embodiment of the invention.

Embodiments of the present invention describe a method and structure that utilize patterned sacrificial spacers for stabilizing an array of micro devices such as micro light emitting diode (LED) devices and micro chips on a carrier substrate so that they are poised for pick up and transfer to a receiving substrate. For example, the receiving substrate may be, but is not limited to, a display substrate, a lighting substrate, a substrate with functional devices such as transistors or integrated circuits (ICs), or a substrate with metal redistribution lines. While embodiments of some of the present invention are described with specific regard to micro LED devices comprising p-n diodes, it is to be appreciated that embodiments of the invention are not so limited and that certain embodiments may also be applicable to other micro semiconductor devices which are designed in such a way so as to perform a predetermined electronic function (e.g. diode, transistor, integrated circuit) or photonic function (LED, laser). Other embodiments of the present invention are described with specific regard to micro devices including circuitry. For example, the micro devices may be based on silicon or SOI wafers for logic or memory applications, or based on GaAs wafers for RF communications applications.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "upon", "over", "spanning", "to", "between", and "on" as used herein may refer to a relative position of one layer with respect to other layers. One layer "upon", "over", "spanning", or "on" another layer or bonded "to" another layer may be directly in contact with the other layer or may have one or more intervening layers. One layer "between" layers may be directly in contact with the layers or may have one or more intervening layers.

The terms "micro" device, "micro" LED device, or "micro" chip as used herein may refer to the descriptive size of certain devices, devices, or structures in accordance with embodiments of the invention. As used herein the term "micro device" specifically includes "micro LED device" and "micro chip". As used herein, the terms "micro" devices or structures may refer to the scale of 1 to 100 µm. However, it is to be appreciated that embodiments of the present invention are not necessarily so limited, and that certain aspects of the embodiments may be applicable to larger, and possibly smaller "micro" device or structure size scales. In an embodiment, a single micro device in an array of micro devices, and a single electrostatic transfer head in an array of electrostatic transfer heads both have a maximum dimension, for example length or width, of 1 to 100 µm. In an embodiment, the top contact surface of each micro device or electrostatic transfer head has a maximum dimension of 1 to 100 µm, or more specifically 3 to 20 µm. In an embodiment, a pitch of an array of micro devices, and a corresponding array of electrostatic transfer heads is (1 to 100 µm) by (1 to 100 µm), for example a 20 µm by 20 µm pitch or 5 µm by 5 µm pitch.

In the following embodiments, the mass transfer of an array of pre-fabricated micro devices with an array of transfer heads is described. For example, the pre-fabricated micro devices may have a specific functionality such as, but not limited to, an LED for light-emission, silicon IC for logic and memory, and gallium arsenide (GaAs) circuits for radio frequency (RF) communications. In some embodiments, arrays of micro LED devices which are poised for pick up are described as having a 20 µm by 20 µm pitch, or 5 µm by 5 µm pitch. At these densities, a 6 inch substrate, for example, can accommodate approximately 165 million micro LED devices with a 10 µm by 10 µm pitch, or approximately 660 million micro LED devices with a 5 µm by 5 µm pitch. A transfer tool including an array of transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices.

In one aspect, embodiments of the invention describe a structure utilizing patterned sacrificial spacers for stabilizing an array of micro devices such as micro light emitting diode (LED) devices on a carrier substrate so that they are poised for pick up and transfer to a receiving substrate. In an embodiment, an array of micro devices are held in place on an array of stabilization posts that are between patterned sacrificial spacers on a carrier substrate. In an embodiment, the stabilization posts are formed of an adhesive bonding material. In this manner, the array of stabilization posts may retain the array of micro devices in place on a carrier substrate while also providing a structure from which the array of micro devices are readily picked up. In an embodiment, the adhesive bonding material includes a thermoset material such as, but not limited to, benzocyclobutene (BCB) or epoxy. In an embodiment, the thermoset material may be associated with 10% or less volume shrinkage during curing, or more particularly about 6% or less volume shrinkage during curing. In this manner low volume shrinkage during curing of the adhesive bonding material may not cause delamination between the array of stabilization posts and the array of micro devices, and may allow for uniform adhesion between the array stabilization posts and the array of micro devices supported by the array of stabilization posts.

In one aspect of embodiments of the invention, patterned sacrificial spacers are formed between the array of micro devices and a carrier substrate to increase the planarity of the micro devices that are poised for pick up. It has been observed that the thickness of an adhesive bond layer between two wafers bonded using a conventional adhesive bonding fixture can be non-uniform across the area between the two bonded wafers, despite the use of alignment marks when aligning the two wafers, starting with substantially flat wafers and the use of fixture spacers between the two wafers around the circumference of the wafers. In one scenario, it was observed that when bonding an unpatterned GaN device layer of FIG. 1A described below to a silicon carrier substrate with a BCB adhesive bonding layer of approximately 2 µm thickness, the thickness of the final cured adhesive bonding layer was measured as being in the range between 1.5-9 µm across the carrier substrate. It is believed that the resultant non-uniformity in thickness of the adhesive bonding material (referred to as a stabilization layer in this disclosure below) may be attributed to factors such as particulate contamination, wafer bowing, and local stresses within the wafers. For example, wafer bowing of a sapphire growth substrate supporting an epitaxially grown GaN device layer may be from 50-100 µm in some instances. While the thickness of the GaN device layer remained constant across the substrate, the thickness variation profile of the BCB adhesive bonding material was found to be translated to the GaN device layer surface profiles. Since the micro devices that are formed from the device layer and the transfer heads that transfer the micro devices in accordance with embodiments of the invention may be of the "micro" scale, increasing the planarity of the micro devices with respect to each other and with respect to their carrier substrate may increase the yield of successful transfers of the micro devices from their carrier substrate to a target substrate. During an adhesive bonding operation of the stabilization layer and the carrier substrate, the patterned sacrificial spacers can extend through the stabilization layer to the carrier substrate which results in a more uniform thickness of the stabilization layer beneath the micro devices. With the patterned sacrificial spacers causing a more uniform thickness in the stabilization layer, the micro devices also have a more planar relationship to each other as they more closely conform to the carrier substrate rather than following a curvature of a bowed handle substrate. As a result, the micro devices have an improved planar positioning across the carrier substrate and the height variation of the top surfaces of the micro devices is reduced, promoting a more consistent pick-up location of the micro devices for successful transfer by the electrostatic transfer heads. Furthermore, the patterned sacrificial spacers can be sized to control the thickness of the stabilization layer to be close to a desired dimension.

In one aspect of embodiments of the invention, the array of micro devices are formed in a one-sided process sequence in which a device layer is etched to form an array of micro device mesa structures prior to applying a stabilization layer (the stabilization layer having the adhesive bonding material that forms the stabilization posts). Using this one-sided process may be particularly suitable for certain system requirement and materials. For example, where the micro devices are micro LED devices, the devices layers may be formed from different materials selected for different emission spectra. By way of example, a blue-emitting or green-emitting micro LED device may be formed of a GaN (5.18 Å lattice constant) based material grown on a sapphire substrate (4.76 Å lattice constant), resulting in a lattice mismatch of approximately 0.42 Å. An increased amount of lattice mismatch between a device layer grown on a growth substrate may result in a greater amount of stress in the device layer. It has been observed that when fabricating devices at the "micro" scale, stress in a device layer may cause the device layer to shift laterally upon removal of a growth substrate that the device layer is grown upon. This stress may potentially cause misalignment between the array of micro devices that are formed over an array of stabilization posts. In accordance with embodiments of the invention, a one-sided process sequence is performed in order to reduce the amount of shifting between the micro devices and stabilization posts by forming micro device mesa structures on stabilization posts prior to removing the growth substrate.

Without being limited to a particular theory, embodiments of the invention utilize transfer heads and head arrays which operate in accordance with principles of electrostatic grippers, using the attraction of opposite charges to pick up micro devices. In accordance with embodiments of the present invention, a pull-in voltage is applied to a transfer head in order to generate a grip pressure on a micro device and pick up the micro device. In accordance with embodiments of the invention, the minimum amount of pick up pressure required to pick up a micro device from a stabilization post can be determined by the adhesion strength between the adhesive bonding material from which the stabilization posts are formed and the micro device (or any intermediate layer), as well as the contact area between the top surface of the stabilization post and the micro device. For example, adhesion strength which must be overcome to pick up a micro device is related to the minimum pick up pressure generated by a transfer head as provided in equation (1):

$$P_1A_1=P_2A_2 \qquad (1)$$

where $P_1$ is the minimum grip pressure required to be generated by a transfer head, $A_1$ is the contact area between a transfer head contact surface and micro device contact surface, $A_2$ is the contact area on a top surface of a stabilization post, and $P_2$ is the adhesion strength on the top surface of a stabilization post. In an embodiment, a grip pressure of greater than 1 atmosphere is generated by a transfer head. For example, each transfer head may generate a grip pressure of 2 atmospheres or greater, or even 20 atmospheres or greater without shorting due to dielectric breakdown of the transfer heads. Due to the smaller area, a higher pressure is realized at the top surface of the corresponding stabilization post than the grip pressure generate by a transfer head. In an embodiment, a bonding layer is placed between each micro device and stabilization post in order to aid in bonding each micro device to a receiving substrate. A variety of different bonding layers with different melting temperatures are compatible with embodiments of the invention. For example, heat may or may not be applied to the transfer head assembly, carrier substrate, and/or receiving substrate during the pick up, transfer, and bonding operations. In some embodiments, the bonding layer may be a comparatively higher melting temperature material such as gold. In some embodiments the bonding layer is a comparatively lower melting temperature material such as indium. In some embodiments, the transfer head assembly may be maintained at an elevated temperature during the pick up and transfer operations in order to assist bonding to the receiving substrate without thermal cycling of the transfer head assembly. In one embodiment, the bonding layer is gold, and the bonding layer is not liquefied during the pick up or transfer operations. In one embodiment the bonding layer is indium, and the bonding layer is liquefied during the pick up and transfer operations. In such an embodiment, the bonding layer may be partially picked up and transferred to the receiving substrate.

In another embodiment, the bonding layer is formed of a material characterized by a low tensile strength. For example, indium is characterized by a tensile strength of approximately 4 MPa which can be less than or near the adhesion strength between a gold/BCB bonding interface of 10 MPa or less, and which is significantly lower than an exemplary 30 MPa adhesion strength between a gold/BCB bonding interface (determined with stud pull test) when treated with adhesion promoter AP3000, an organosilane compound in 1-methoxy-2-propoanol available from The Dow Chemical Company. In an embodiment, the bonding layer is cleaved during the pick up operation due to the lower tensile strength, and a phase change is not created during the pick up operation. Though, a phase change may still be created in the portion of the bonding layer which is picked up with the micro device during placement of the micro device onto a receiving substrate to aid in bonding of the micro device to the receiving substrate.

In another aspect, embodiments of the invention describe a manner of forming an array of micro devices which are poised for pick up in which conductive contact layers can be formed on top and bottom surfaces of the micro devices, and annealed to provide ohmic contacts. Where a conductive contact is formed on a top surface of a micro device, the stabilization layer is formed of a material which is capable of withstanding the associated deposition and annealing temperatures. For example, a conductive contact may require annealing at temperatures between 200° C. to 350° C. to form an ohmic contact with the micro device. In this manner, embodiments of the invention may be utilized to form arrays of micro LED devices based upon a variety of different semiconductor compositions for emitting various different visible wavelengths. For example, micro LED growth substrates including active devices layers formed of different materials for emitting different wavelengths (e.g. green and blue wavelengths) can all be processed within the general sequence of operations of the embodiments.

FIG. 1A is an example cross-sectional side view illustration of a bulk LED substrate 100 in accordance with an embodiment of the invention. In the illustrated embodiment, bulk LED substrate 100 includes a growth substrate 102, an epitaxial growth layer 103, and a device layer 105. In an embodiment, growth substrate 102 is sapphire and may be approximately 500 µm thick. Using a sapphire growth substrate may correspond with manufacturing blue emitting LED devices (e.g. 450-495 nm wavelength) or green emitting LED devices (e.g. 495-570 nm wavelength). It is to be appreciated, that while the specific embodiments illustrated and described in the following description may be directed to formation of green or blue emitting LED devices, the following sequences and descriptions are also applicable to the formation of LED devices that emit wavelengths other than blue and green. Epitaxial growth layer 103 may be grown on growth substrate 102 using known epitaxial growth techniques. Epitaxial growth layer 103 may be grown on growth substrate 102 at a relatively high temperature to facilitate gliding out dislocations in the layer. In an embodiment, epitaxial growth layer 103 is a gallium nitride (GaN) based material.

Device layer 105 may be formed on epitaxial growth layer 103, as shown in FIG. 1A. In an embodiment the growth substrate 102 is approximately 200 µm thick. The epitaxial growth layer 103 may be any suitable thickness such as between 300 Å-5 µm. In the illustrated embodiment, device layer 105 includes layers for forming LED devices. In FIG. 1A, a zoomed-in view of an example device layer 105 illustrates one or more quantum well layers 110 between doped semiconductor layer 108 (e.g. n-doped) and doped semiconductor layer 112 (e.g. p-doped), although the doping of layers 108 and 112 may be reversed. In an embodiment, doped semiconductor layer 108 is formed of GaN and is approximately 0.1 µm to 3 µm thick. The one or more quantum well layers 110 may have a thickness of approximately 0.5 µm. In an embodiment, doped semiconductor layer 112 is formed of GaN, and is approximately 0.1 µm to 2 µm thick.

Figure 1B:
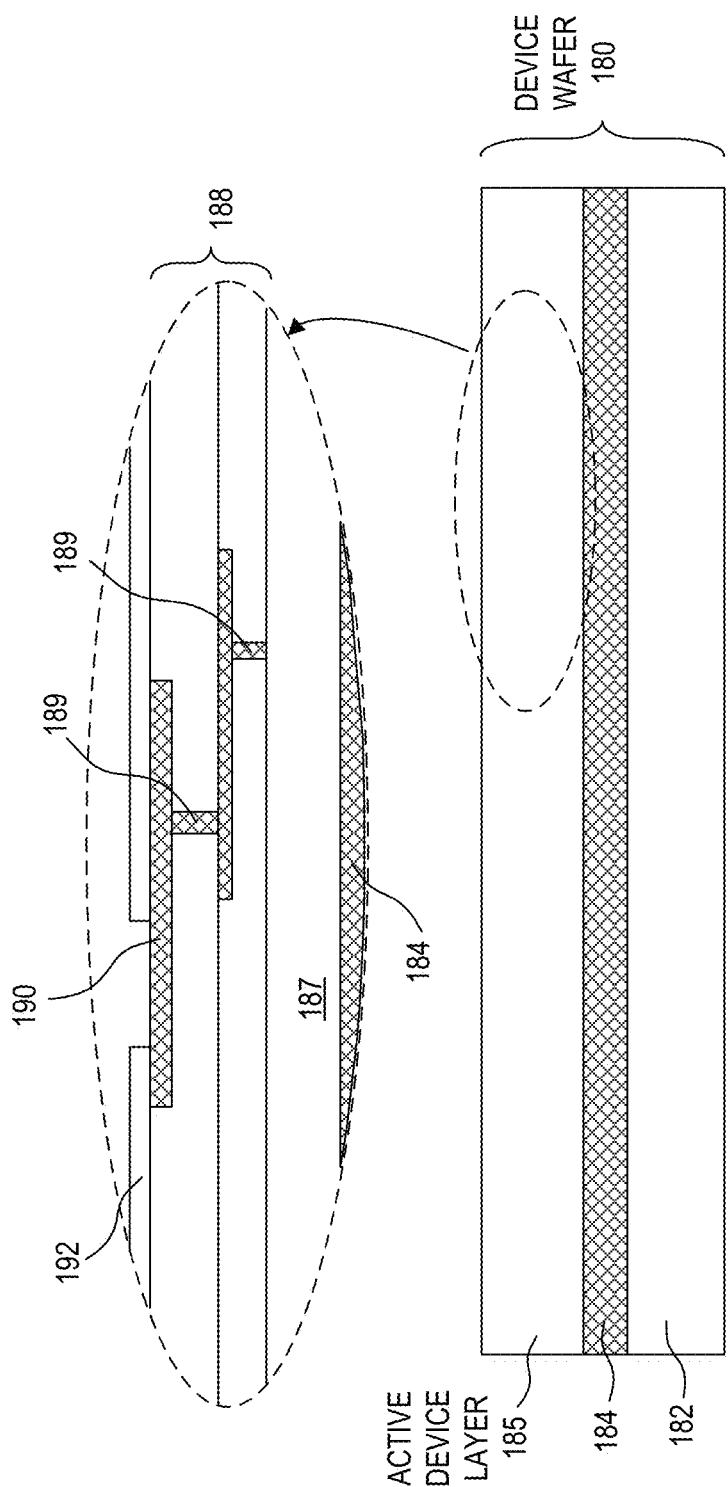
FIG. 1B is a cross-sectional side view illustration of a device wafer including circuitry in accordance with an embodiment of the invention.

FIG. 1B is a cross-sectional side view illustration of a device wafer 180 including circuitry in accordance with an embodiment of the invention. In accordance with embodiments of the invention, the device wafer 180 may be formed of a variety of materials depending upon the desired function. For example, in an embodiment, the device wafer 180 is a silicon wafer, or silicon-on-insulator (SOI) wafer for logic or memory. In an embodiment, the device wafer 180 is a gallium arsenide (GaAs) wafer for radio frequency (RF) communications. These are merely examples, and embodiments of the invention envision are not limited to silicon or GaAs wafers, nor are embodiments limited to logic, memory, or RF communications.

In an embodiment, the device wafer 180 includes an active device layer 185, optional buried oxide layer 184, and base substrate 182. In the interest of clarity, the following description is made with regard to an SOI device wafer 180, including an active device layer 185, buried oxide layer 184, and base silicon substrate 182, though other types of devices wafers may be used, including bulk semiconductor wafers. In an embodiment, the active device layer 185 may include working circuitry to control one or more LED devices. In some embodiments, back-end processing may be performed within the active device layer 185. Accordingly, in an embodiment, the active device layer 185 includes an active silicon layer 187 including devices such as transistors, metal build-up layers 188 including interconnects 189, bonding pads 190, and passivation 192.

In the interest of clarity, the portion of the disclosure associated with FIGS. 2A-14C is made with regard to the bulk LED substrate of FIG. 1A for fabricating micro LED devices. However, it is appreciated that the process sequences in the following description may be used to fabricate other micro devices. For example, micro chips may be similarly manufactured by substituting bulk LED substrate 100 with device wafer 180 and using the same or similar processes as described with reference to bulk LED substrate 100. Accordingly, in the following description, both the growth substrate 102 and base substrate 182 can alternatively be referred to more generically as a "handle" substrate so as to not preclude the processing sequence on a growth substrate 102 from being applied to the processing sequence on a base substrate 182.

FIG. 2A is a cross-sectional side view illustration of a patterned conductive contact layer on bulk LED substrate 100 in accordance with an embodiment of the invention. A conductive contact layer may be formed over device layer 105 using a suitable technique such as sputtering or electron beam physical deposition followed by etching or liftoff to form the array of conductive contacts 120. In an embodiment, the array of conductive contacts 120 have a thickness of approximately 0.1 µm-2 µm, and may include a plurality of different layers. For example, a conductive contact 120 may include an electrode layer 121 for ohmic contact, a mirror layer 122, an adhesion/barrier layer 123, a diffusion barrier layer 124, and a bonding layer 125. In an embodiment, electrode layer 121 may make ohmic contact to a p-doped semiconductor layer 112, and may be formed of a high work-function metal such as nickel. In an embodiment, a mirror layer 122 such as silver is formed over the electrode layer 121 to reflect the transmission of the visible wavelength. In an embodiment, titanium is used as an adhesion/barrier layer 123, and platinum is used as a diffusion barrier 124 to bonding layer 125. Bonding layer 125 may be formed of a variety of materials which can be chosen for bonding to the receiving substrate and/or to achieve the requisite tensile strength or adhesion or surface tension with the stabilization posts (yet to be formed). Following the formation of layers 121-125, the substrate stack can be annealed to form an ohmic contact. For example, a p-side ohmic contact may be formed by annealing the substrate stack at 510° C. for 10 minutes.

In an embodiment, bonding layer 125 is formed of a conductive material (both pure metals and alloys) which can diffuse with a metal forming a contact pad on a receiving substrate (e.g. gold, indium, or tin contact pad) and has a liquidus temperature above 200° C. such as tin (231.9° C.) or bismuth (271.4° C.), or a liquidus temperature above 300° C. such as gold (1064° C.) or silver (962° C.). In some embodiments, bonding layer 125 such as gold may be selected for its poor adhesion with the adhesive bonding material used to form the stabilization posts. For example, noble metals such as gold are known to achieve poor adhesion with BCB. In this manner, sufficient adhesion is created to maintain the array of micro LED devices on the stabilization posts during processing and handling, as well as to maintain adjacent micro LED devices in place when another micro LED device is being picked up, yet also not create too much adhesion so that pick up can be achieved with an applied pick up pressure on the transfer head of 20 atmospheres or less, or more particularly 5-10 atmospheres.

In the embodiment illustrated in FIG. 2A, where bonding layer 125 has a liquidus temperature above the annealing temperature for forming the p-side ohmic contact, the anneal (e.g. 510° C. for 10 minutes) can be performed after the formation of the patterned conductive contact layer 120, including bonding layer 125. Where bonding layer 125 has a liquidus temperature below the annealing temperature for forming the p-side ohmic contact, the bonding layer 125 may be formed after annealing.

Figure 2B:
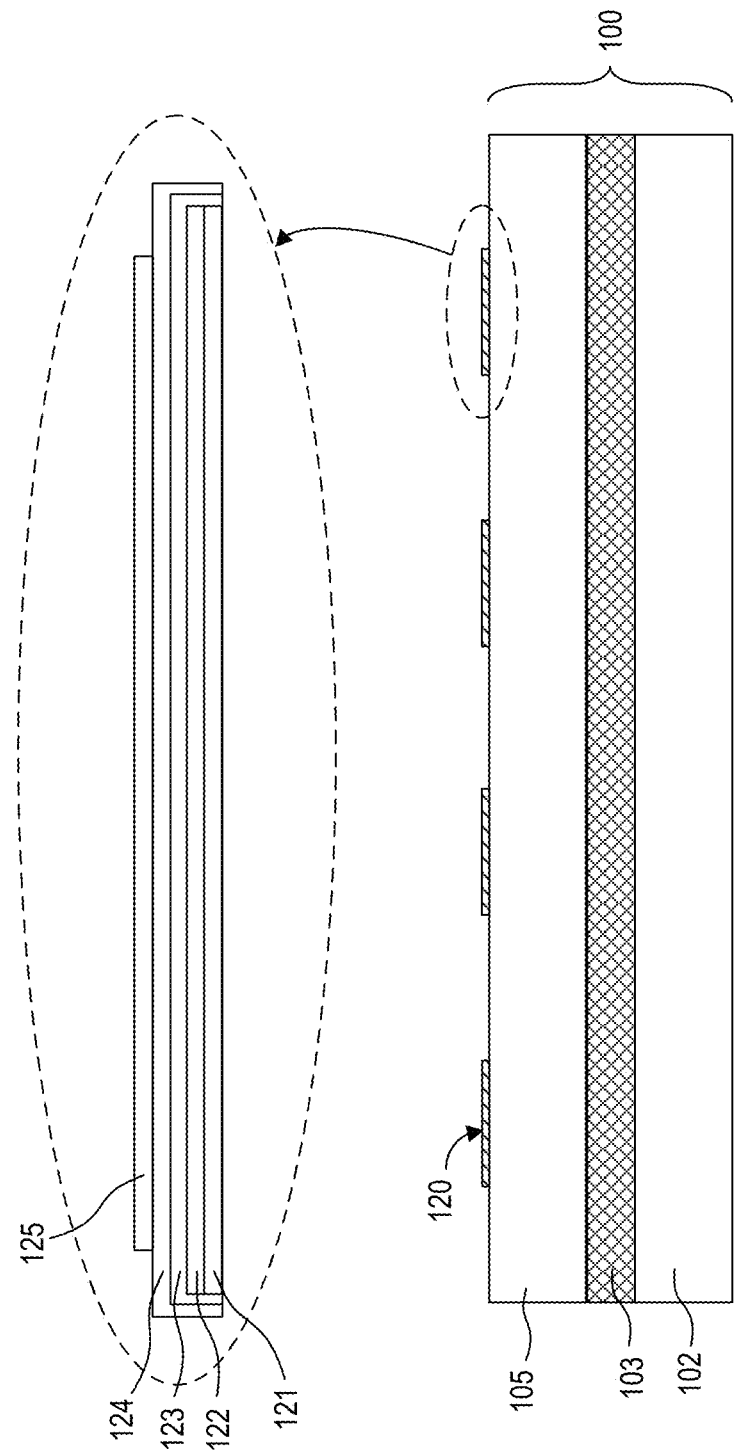
FIG. 2B is a cross-sectional side view illustration of a patterned conductive contact layer on a bulk LED substrate in accordance with an embodiment of the invention.

FIG. 2B is a cross-sectional side view illustration of a patterned conductive contact layer on a bulk LED substrate 100 in accordance with an embodiment of the invention. The embodiment illustrated in FIG. 2B may be particularly useful where bonding layer 125 is formed of a material with a liquidus temperature below the annealing temperature of the p-side ohmic contact, though the embodiment illustrated in FIG. 2B is not limited to such and may be used where the bonding layer 125 is formed of a material with a liquidus temperature above the annealing temperature of the p-side ohmic contact. In such embodiments, electrode layer 121 and mirror layer 122 may be formed similarly as described with regard to FIG. 2A. Likewise, adhesion/barrier layer 123 and diffusion barrier 124 may be formed similarly as described with regard to FIG. 2A with one difference being that the layers 123 and 124 may optionally wrap around the sidewalls of the layers 121 and 122. Following the formation of layers 121-124, the substrate stack can be annealed to form an ohmic contact. For example, a p-side ohmic contact may be formed by annealing the substrate stack at 510° C. for 10 minutes. After annealing layers 121-124 to form the p-side ohmic contact, the bonding layer 125 may be formed. In an embodiment, the bonding layer 125 has a smaller width than for layers 121-124.

In an embodiment, bonding layer 125 has a liquidus temperature or melting temperature of approximately 350° C. or lower, or more specifically of approximately 200° C. or lower. At such temperatures the bonding layer may undergo a phase change without substantially affecting the other components of the micro LED device. In an embodiment, the resultant bonding layer may be electrically conductive. In accordance with some embodiments, the bonding layer 125 may be a solder material, such as an indium, bismuth, or tin based solder, including pure metals and metal alloys. In a particular embodiment, the bonding layer 125 is indium.

Figure 3:
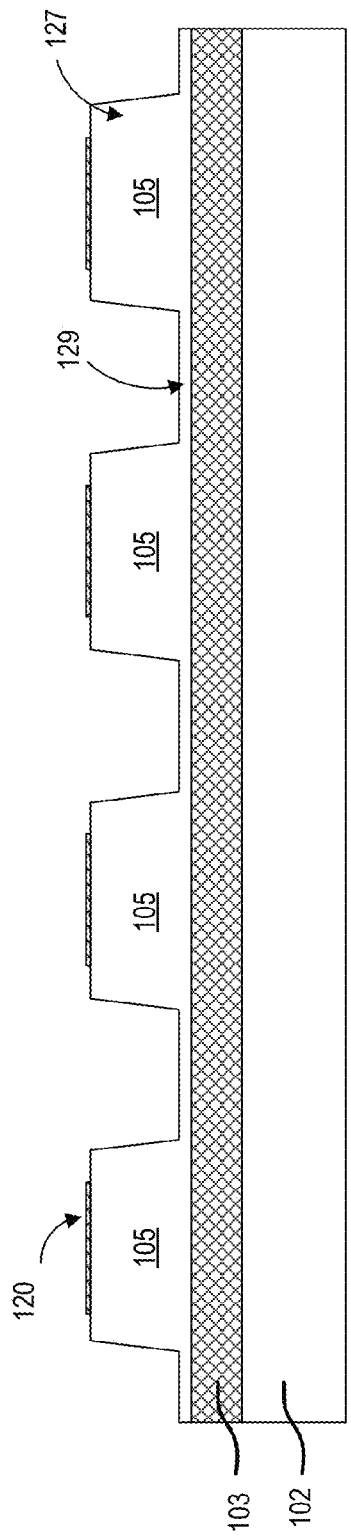
FIG. 3 is a cross-sectional side view illustration of a device layer patterned to form an array of micro device mesa structures over a handle substrate in accordance with an embodiment of the invention.

FIG. 3 is a cross-sectional side view illustration of device layer 105 patterned to form an array of micro device mesa structures 127 over a handle substrate that includes growth substrate 102 and epitaxial growth layer 103 in accordance with an embodiment of the invention. Etching of layers 108, 110, and 112 of device layer 105 may be accomplished using suitable etch chemistries for the particular materials. For example, n-doped semiconductor layer 108, quantum well layer(s) 110, and p-doped layer 112 may be dry etched in one operation with a $BCl_3$ and $Cl_2$ chemistry. As FIG. 3 illustrates, device layer 105 may not be etched completely through which leaves unremoved portions 129 of device layer 105 that connect the micro device mesa structures 127. In one example, the etching of device layer 105 is stopped in n-doped semiconductor layer 108 (which may be n-doped GaN). A height of the micro device mesa structures 127 (not including the thickness of the unremoved portions 129) may correspond substantially to the height of the laterally separate micro devices to be formed. In accordance with embodiments of the invention, the device layer 105 may alternatively be completely etched through. For example, where the bulk LED substrate 100 is replaced with a device wafer 180 in the processing sequence, etching may stop on the buried oxide layer 184.

Figure 4:
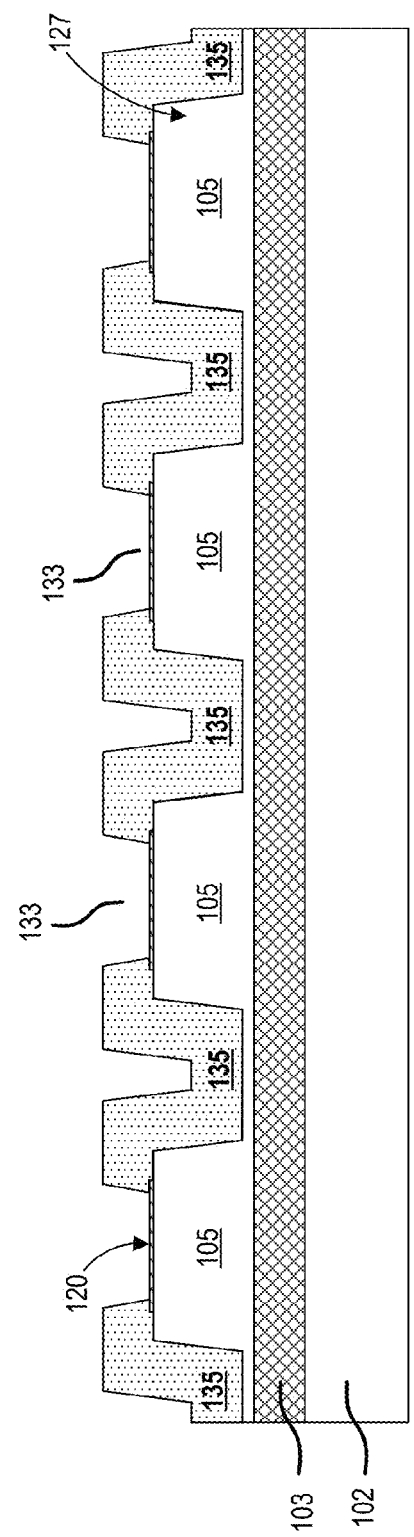
FIG. 4 is a cross-sectional side view illustration of a course sacrificial layer for patterned sacrificial spacers formed over an array of micro device mesa structures in accordance with an embodiment of the invention.

FIG. 4 is a cross-sectional side view illustration of a sacrificial layer 135 for patterned sacrificial spacers formed over an array of micro device mesa structures 127 in accordance with an embodiment of the invention. In an embodiment, sacrificial layer 135 is between approximately 2 and 5 microns thick. In an embodiment, sacrificial layer 135 is formed of an oxide (e.g. $SiO_2$) or nitride (e.g. $SiN_x$), though other materials may be used which can be selectively removed with respect to the other layers. In an embodiment, sacrificial layer 135 is deposited by sputtering, low temperature plasma enhanced chemical vapor deposition (PECVD), or electron beam evaporation to create a low quality layer, which may be more easily removed than a higher quality layer deposited by other methods such as atomic layer deposition (ALD) or high temperature PECVD.

After forming sacrificial layer 135, sacrificial layer 135 is patterned to form an array of openings 133 over the array of conductive contacts 120. In an example embodiment, a fluorinated chemistry (e.g. HF vapor, $CF_4$, or $SF_6$ plasma) is used to etch the $SiO_2$ or $SiN_x$ sacrificial layer 135.

Figure 9:
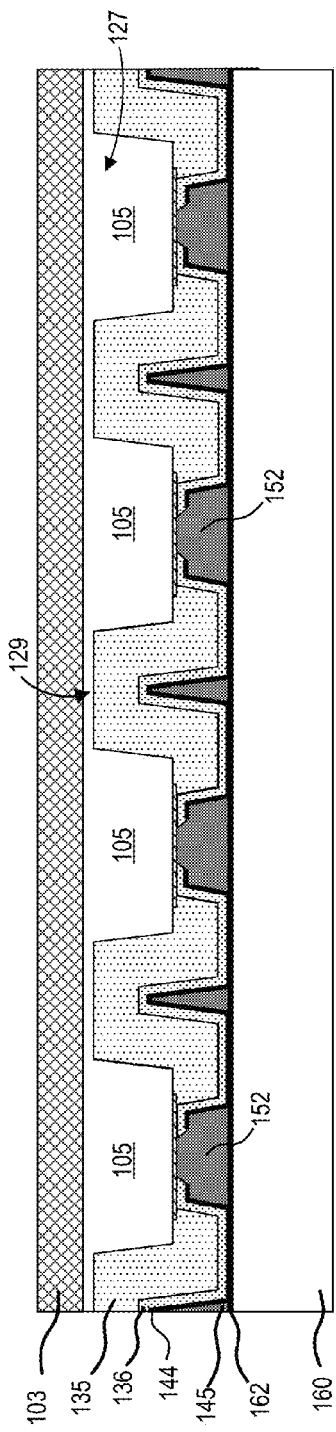
FIG. 9 is a cross-sectional side view illustration of the removal of a growth substrate in accordance with an embodiment of the invention.

FIG. 5 is a cross-sectional side view illustration of an adhesion promoter layer 144 and a sacrificial layer 136 including an array of openings 133 for patterned sacrificial spacers formed over a sacrificial layer 135 in accordance with an embodiment of the invention. In an embodiment, sacrificial layer 136 is between approximately 0.5 and 2 microns thick. Sacrificial layer 136 may be made from the same material and formed using a similar method as sacrificial layer 135. Together, sacrificial layers 135 and 136 combine to make patterned sacrificial spacers 137. Sacrificial layer 135 may be referred to as "course" sacrificial layer 135 and sacrificial layer 136 may be referred to as "fine" sacrificial layer 136. The combined thickness of sacrificial layers 135 and 136 (and any intervening layers) will set the standoff height of the patterned sacrificial spacers 137, which will consequently define the spacing height between laterally separate micro devices 128 and carrier substrate 160, in FIG. 10. Additionally, the shape of patterned sacrificial spacers 137 defines the shape of openings 133, which will later define the shape of stabilization posts 152, as shown in FIG. 9. Furthermore, a thickness of fine sacrificial layer 136 will define a height of a stabilization post protrusion 151 that is included in each stabilization post 152, which will be discussed in association with FIG. 11. Sacrificial layer 135 may be used to provide the bulk of the standoff height of patterned sacrificial spacers 137, while sacrificial layer 136 may be used to define the shape of stabilization post protrusions 151. Finer patterning of sacrificial layer 136 may allow for more uniform definition of the shapes of stabilization post protrusions 151, which will consequently make the pull force required to separate micro devices 128 from the stabilization post protrusions 151 more uniform. Furthermore, the finer patterning offered by sacrificial layer 136 may allow for more exact positional placement of the stabilization post protrusions 151 in relation to conductive contacts 120. It is appreciated that although the illustrated embodiments show patterned sacrificial spacers 137 being made of two sacrificial layers (135 and 136), patterned sacrificial spacers 137 may be made from only one layer with the shape of openings 133 achieved using a series of masking and etching steps.

Still referring to FIG. 5, after the formation of sacrificial layer 136, an adhesion promoter layer 144 may optionally be formed in order to increase adhesion of the stabilization layer 145 (not yet formed) to the sacrificial layer 136. A thickness of 100-300 angstroms may be sufficient to increase adhesion.

Specific metals (for use in conductive contacts 120) that have good adhesion to both the sacrificial layer 136 and a BCB stabilization layer (not yet formed) include, but are not limited to, titanium and chromium. For example, sputtered or evaporated titanium or chromium can achieve an adhesion strength (stud pull) of greater than 40 MPa with BCB.

FIG. 5 illustrates the optional adhesion promoter layer 144 being patterned with the sacrificial layer 136 to continue defining openings 133. In other embodiments, adhesion promoter layer 144 may optionally be formed after patterning sacrificial layer 136. In such embodiments, the adhesion promoter layer 144 may be formed within the openings 133 and on conductive contacts 120. This may have the effect of increasing the pull force required to subsequently separate conductive contacts 120 and stabilization layer 145 (yet to be formed). In one embodiment, the structure including patterned sacrificial layer 136 is treated with an adhesion promoter such as AP3000, available from The Dow Chemical Company, in the case of a BCB stabilization layer 145 in order to condition the underlying structure. AP3000, for example, can be spin coated onto the underlying structure, and soft baked (e.g. 100° C.) or spun dry to remove the solvents prior to applying the stabilization layer 145 over the sacrificial layer 136.

Forming fine sacrificial layer 136 defines the dimensions of the stabilization post protrusions 151. As will become more apparent in the description of FIG. 11, the height, length, and width of the stabilization post protrusion portion of openings 133 between sacrificial layer 136 correspond to the height, length, and width (area) of the stabilization post protrusions 151 to be formed, and resultantly the adhesion strength that must be overcome to pick up the array of micro devices (e.g. micro LED devices) poised for pick up on the array of stabilization post protrusions 151. In an embodiment, the stabilization post protrusion portions of openings 133 are formed using lithographic techniques and have a length and width of approximately 1 µm by 1 µm, though the stabilization post protrusion portion of openings 133 may be larger or smaller so long as the openings have a width (or area) that is less than the width (or area) of the conductive contacts 120 and/or micro LED devices. Furthermore, the height, length and width of the openings 131 between the micro device mesa structures 127 will correspond to the height, length and width of the stabilization cavity sidewalls to be formed. Accordingly, adjusting thickness of the sacrificial layers 135 and 136 and the space separating adjacent micro device mesa structures 127 will effect the size of the stabilization cavity sidewalls.

FIG. 6 is a cross-sectional side view illustration of a stabilization layer 145 formed over an adhesion promoter layer 144 and a layer of patterned sacrificial spacers 137, within an array of openings 133 between the patterned sacrificial spacers 137, and within an array of openings 131 between micro device mesa structures 127 in accordance with an embodiment of the invention. Stabilization layer 145 may be formed of an adhesive bonding material. The adhesive bonding material may be a thermosetting material such as benzocyclobutene (BCB) or epoxy. In an embodiment, the thermosetting material may be associated with 10% or less volume shrinkage during curing, or more particularly about 6% or less volume shrinkage during curing so as to not delaminate from the conductive contacts 120 on the micro device mesa structures 127.

In an embodiment, stabilization layer 145 is spin coated or spray coated over the patterned sacrificial layer 136, though other application techniques may be used. For spin coating, the structure may be spun at 5,000 RPM to form the stabilization layer 145 at a thickness of 5 µm±0.5 µm. The thickness of 5 µm±0.5 µm for the stabilization layer 145 may correspond to a dimension from the bottom of an opening 131 to the top of stabilization layer 145, while stabilization layer 145 in other locations (measured from the top of patterned sacrificial spacers 137) may ultimately be thinner than the 5 µm±0.5 µm thickness. It is understood that a 5 µm±0.5 µm thickness of stabilization layer 145 is an example and may vary depending on the thickness of layers 135 and 136. Following application of the stabilization layer 145, the structure may be pre-baked at between 120 and 200° C. for 10-30 minutes to remove solvents, resulting in a b-staged layer. In an embodiment, the stabilization layer 145 is thicker than the height of openings 131 (when present) between micro device mesa structures 127. In this manner, the thickness of the stabilization layer 145 filling openings 133 (between patterned sacrificial spacers 137) will become stabilization posts 152, the thickness of the stabilization layer 145 filling openings 131 will become stabilization cavity sidewalls 147 (discussed further in association with FIG. 11), and the remainder of the thickness of the stabilization layer 145 over the filled openings 131 and 133 can function to adhesively bond the bulk LED substrate 100 to a carrier substrate. In one embodiment, the height of patterned sacrificial spacers 137 is 80-90% of a thickness of a stabilization layer 145. It is thought that patterned sacrificial spacers 137 that are taller than stabilization layer 145 can cause air gaps to form between stabilization layer 145 and carrier substrate 160, yet patterned sacrificial spacers 137 that are too short may make it difficult to force excess stabilization layer 145 away.

Figure 7:
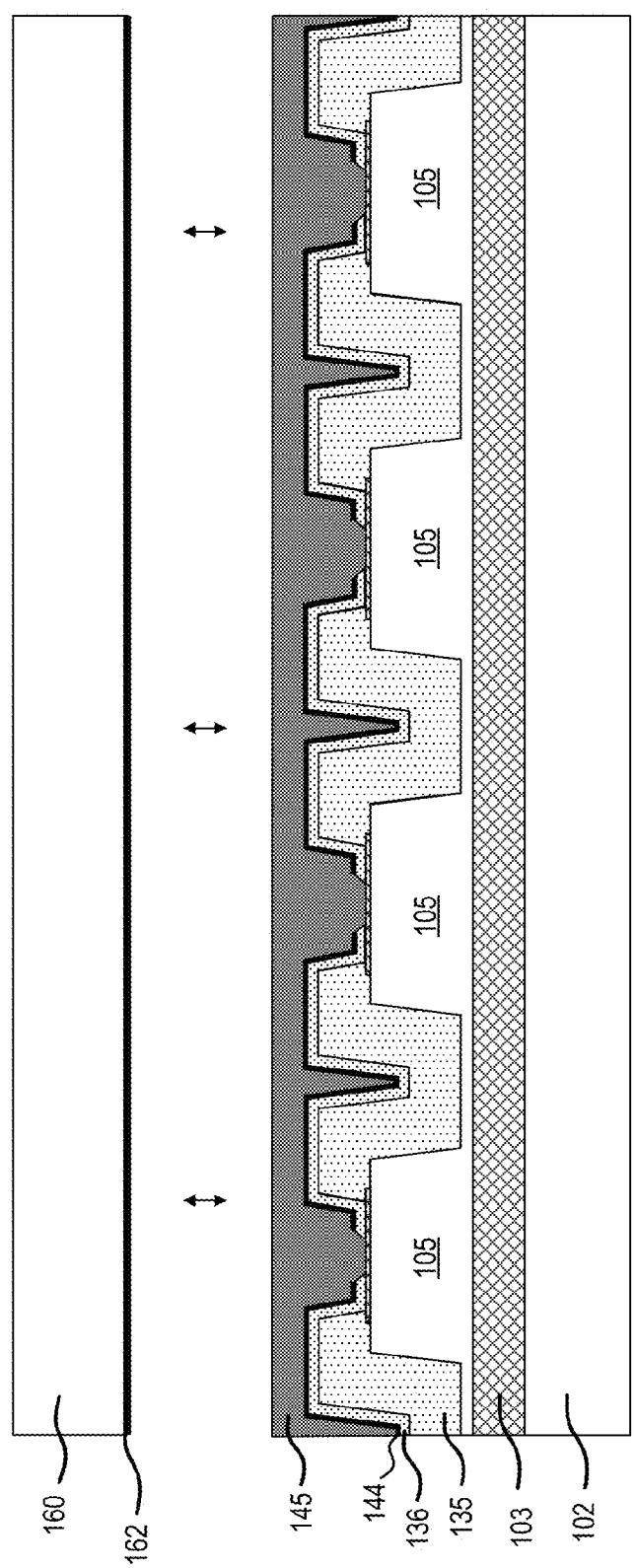
FIG. 7 is a cross-sectional side view illustration of bringing together a carrier substrate and micro device mesa structures formed on a handle substrate in accordance with an embodiment of the invention.
Figure 8:
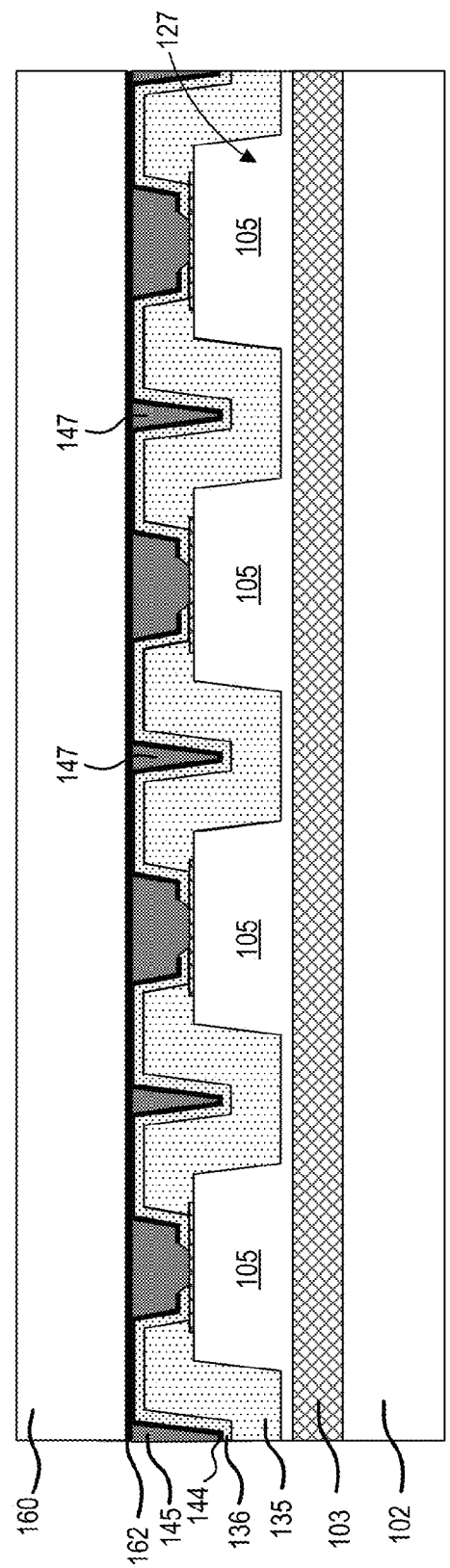
FIG. 8 is a cross-sectional side view illustration of a carrier substrate bonded to micro device mesa structures in accordance with an embodiment of the invention.

FIG. 7 is a cross-sectional side view illustration of bringing together a carrier substrate 160 and micro device mesa structures 127 formed on handle substrate in accordance with an embodiment of the invention. FIG. 8 is a cross-sectional side view illustration of carrier substrate 160 after being bonded to micro device mesa structures 127 with stabilization layer 145 in accordance with an embodiment of the invention. FIG. 8 shows that patterned sacrificial spacers 137 are brought to rest upon carrier substrate 160 so that carrier substrate 160 is supporting patterned sacrificial spacers 137. Since carrier substrate 160 is supporting patterned sacrificial spacers 137 (although intervening layers such as adhesion promotion layers 144/162 may come between) stabilization layer 145 is pushed away making stabilization layer 145 non-contiguous between the illustrated patterned sacrificial spacers 137 and the illustrated cavity sidewalls 147. In the illustrated embodiment, adhesion promoter layer 144 and 162 may be disposed between sacrificial layer 136 and carrier substrate 160, but in other embodiments, carrier substrate 160 may contact sacrificial layer 136.

Since during bonding patterned sacrificial spacers 137 extends through stabilization layer 145 to the more solid carrier substrate 160, the planar alignment of micro devices 128 (illustrated in FIGS. 10 and 11) and uniformity in thickness of the stabilization layer 145 across the carrier substrate 160 may improve. The improvement may manifest in comparison to having micro devices 128 and associated structure "float" atop stabilization layer 145 without any solid underpinning to carrier substrate 160. Since the micro devices and the transfer heads that transfer the micro devices may be on the micro scale, increasing the planarity of the micro devices with respect to each other and with respect to their carrier substrate 160 may increase the yield of successful transfers of the micro devices from their carrier substrate to a target substrate. Due to the improved planar positioning of the micro devices, the pick-up location of the micro devices becomes better defined for successful transfer by the electrostatic transfer heads.

Still referring to FIG. 8, carrier substrate 160 is bonded to the micro device mesa structures 127 via the adhesion properties of stabilization layer 145. In one embodiment, 1,100 kg of force is applied for between two and three hours to bond carrier substrate 160 to the micro device mesa structures 127. Bonding may take place at approximately 200° C. In order to increase adhesion with the stabilization layer 145, an adhesion promoter layer 162 can be applied to the carrier substrate 160 prior to bonding the micro device structure (e.g. bulk LED substrate 100) to the carrier substrate 160 similarly as described above with regard to adhesion promoter layer 144. Likewise, in addition to, or in alternative to adhesion promoter layer 162, an adhesion promoter such as AP3000 may be applied to the surface of the carrier substrate 160 or adhesion promoter layer 162. Alternatively, stabilization layer 145 can be formed on carrier substrate 160 prior to bonding the carrier substrate 160 to the handle substrate. For example, the micro device structure including the patterned sacrificial layers 135 and 136 and micro device mesa structures 127 can be embossed into an a-staged or b-staged stabilization layer 145 formed on the carrier substrate 160.

Depending upon the particular material of stabilization layer 145, stabilization layer 145 may be thermally cured, or cured with application of UV energy. In an embodiment, stabilization layer 145 is a-staged or b-staged prior to bonding the carrier substrate to the micro device structure, and is cured at a temperature or temperature profile ranging between 150° C. and 300° C. Where stabilization layer 145 is formed of BCB, curing temperatures should not exceed approximately 350° C., which represents the temperature at which BCB begins to degrade. In accordance with embodiments including a bonding layer 125 material characterized by a liquidus temperature (e.g. gold, silver, bismuth) greater than 250° C., full-curing of a BCB stabilization layer 145 can be achieved in approximately 1 hour or less at a curing temperature between 250° C. and 300° C. Other bonding layer 125 materials such as Sn (231.9° C.) may require between 10-100 hours to fully cure at temperatures between 200° C. and the 231.9° C. liquidus temperature. In accordance with embodiments, including a bonding layer 125 material characterized by a liquidus temperature below 200° C. (e.g. indium), a BCB stabilization layer 145 may only be partially cured (e.g. 70% or greater). In such an embodiment the BCB stabilization layer 145 may be cured at a temperature between 150° C. and the liquidus temperature of the bonding layer (e.g. 156.7° C. for indium) for approximately 100 hours to achieve at least a 70% cure.

Achieving a 100% full cure of the stabilization layer 145 is not required in accordance with embodiments of the invention. More specifically, the stabilization layer 145 may be cured to a sufficient curing percentage (e.g. 70% or greater for BCB) at which point the stabilization layer 145 will no longer reflow. Moreover, it has been observed that such partially cured (e.g. 70% or greater) BCB stabilization layer 145 may possess sufficient adhesion strength with the carrier substrate 160 and sacrificial layer 136 (or any intermediate layer(s)).

FIG. 9 is a cross-sectional side view illustration of the removal of growth substrate 102 in accordance with an embodiment of the invention. When growth substrate 102 is sapphire, laser lift off (LLO) may be used to remove the sapphire. Removal may be accomplished by other techniques such as grinding and etching, depending upon the material selection of the growth substrate 102.

Figure 10:
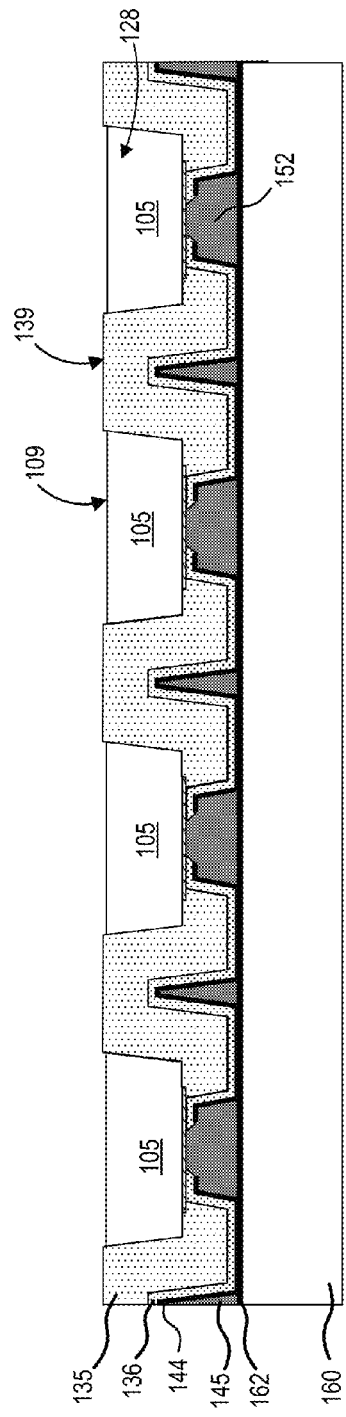
FIG. 10 is a cross-sectional side view illustration of the removal of an epitaxial growth layer and a portion of a device layer in accordance with an embodiment of the invention.

FIG. 10 is a cross-sectional side view illustration of the removal of epitaxial growth layer 103 and a portion of a device layer 105 in accordance with an embodiment of the invention. The removal of epitaxial growth layer 103 and a portion of device layer 105 may be accomplished using one or more of chemical-mechanical-polishing (CMP), dry polishing, or dry etch. FIG. 10 illustrates that that unremoved portions 129 of device layer 105 that connected the micro device mesa structures 127 in FIG. 9 are removed in FIG. 10, which leaves laterally separated micro devices 128. In an embodiment, removing unremoved portions 129 of device layer 105 includes thinning the array of micro device mesa structures 127 so that an exposed top surface 109 of each of the laterally separate micro devices 128 is below an exposed top surface 139 of sacrificial layer 135.

In embodiments where the bulk LED substrate 100 includes epitaxial growth layer 103, a portion of the doped semiconductor layer 108 adjacent the epitaxial growth layer 103 may also function as a "buffer". For example, epitaxial growth layer 103 may or may not be doped, while semiconductor layer 108 is n-doped. It may be preferred to remove the epitaxial growth layer 103 using any suitable technique such as wet or dry etching, or CMP, followed by a timed etch of the remainder of the doped semiconductor layer 108 resulting in the structure illustrated in FIG. 10. In this manner, the thickness of the laterally separate micro devices 128 is largely determined by the etching operation illustrated in FIG. 3 for the formation of the micro device mesa structures 127, combined with the timed etch or etch stop detection of the etching operation illustrated in FIG. 10. A timed etch of unremoved portions of device layer 105 may correspond to etching a portion of doped semiconductor layer 108.

Figure 11:
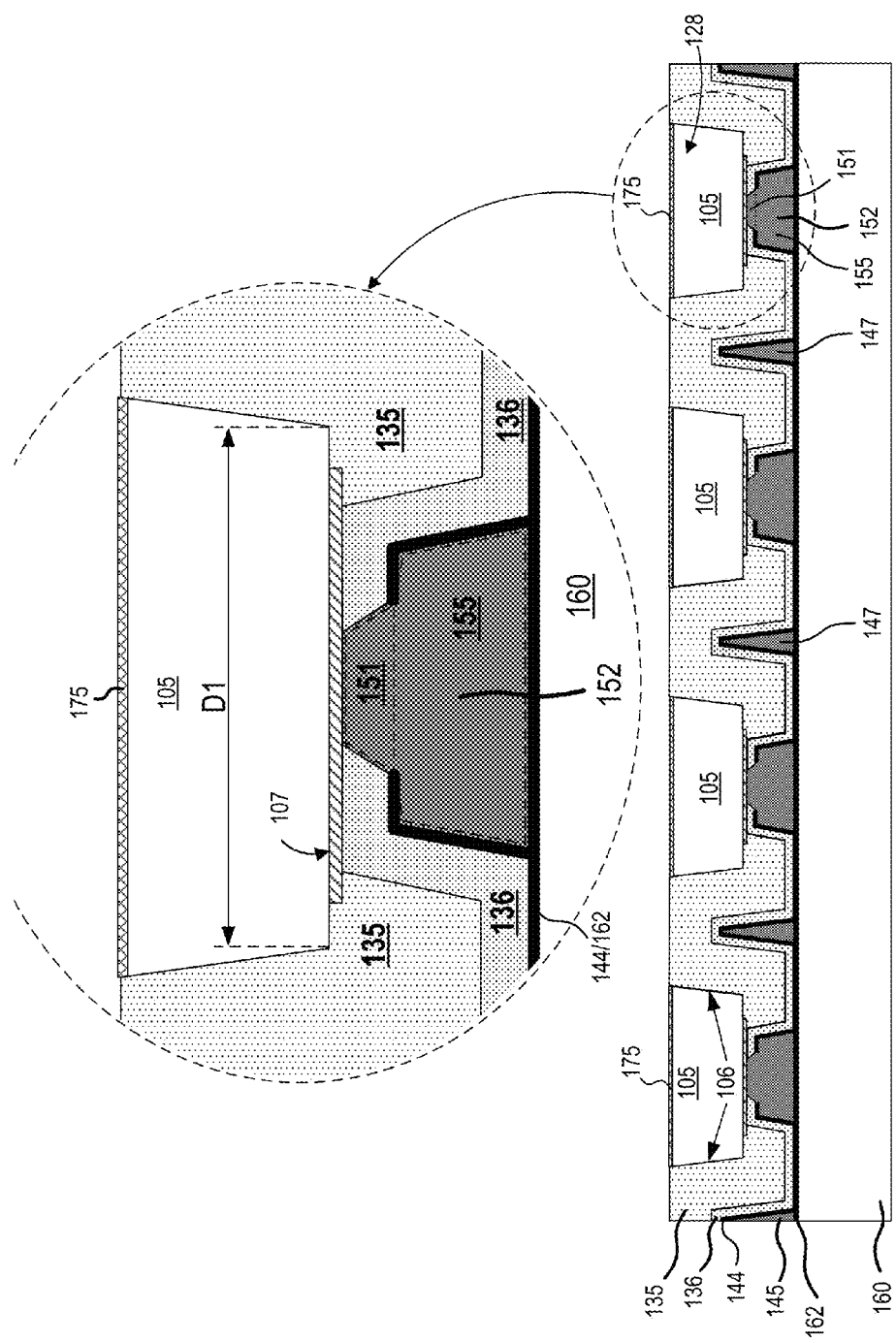
FIG. 11 is a cross-sectional side view illustration of patterned conductive contacts formed over an array of laterally separate micro devices in accordance with an embodiment of the invention.

FIG. 11 is a cross-sectional side view illustration of patterned conductive contacts 175 formed over an array of laterally separate micro devices 128 in accordance with an embodiment of the invention. To form conductive contacts 175, a conductive contact layer is formed over micro devices 128 and sacrificial layer 135. The conductive contact layer may be formed of a variety of conductive materials including metals, conductive oxides, and conductive polymers. In an embodiment, conductive contacts are formed of a metal or metal alloy. In an embodiment, the conductive contact layer is formed using a suitable technique such as sputtering or electron beam physical deposition. For example, the conductive contact layer may include BeAu metal alloy, or a metal stack of Au/GeAuNi/Au layers. The conductive contact layer can also be a combination of one or more metal layers and a conductive oxide. In an embodiment, after forming the conductive contact layer, the substrate stack is annealed to generate an ohmic contact between the conductive contact layer and the device layer of micro devices 128. Where the stabilization layer 145 is formed of BCB, the annealing temperature may be below approximately 350° C., at which point BCB degrades. In an embodiment, annealing is performed between 200° C. and 350° C., or more particularly at approximately 320° C. for approximately 10 minutes. After the conductive contact layer is deposited, it can be patterned and etched to form conductive contacts 175, which may be n-metal conductive contacts.

The resultant structures illustrated in FIG. 11 are robust enough for handling and cleaning operations to prepare the substrate structure for subsequent sacrificial layer removal and electrostatic pick up. In an exemplary embodiment where the array of micro devices 128 have a pitch of 5 microns, each micro device 128 may have a minimum width (e.g. along the top surface 109) of 4.5 µm, and a separation between adjacent micro devices 128 of 0.5 µm. It is to be appreciated that a pitch of 5 microns is exemplary, and that embodiments of the invention encompass any pitch of 1 to 100 µm as well as larger, and possibly smaller pitches.

FIG. 11 illustrates a structure having a stabilization layer 145 that includes an array of stabilization posts 152. The zoomed-in portion of FIG. 11 shows that each stabilization post 152 includes a stabilization post protrusion 151 and a stabilization post platform 155 defined by the dashed lines. Stabilization post protrusion 151 is disposed above stabilization post platform 155 and stabilization post platform 155 is disposed between stabilization post protrusion 151 and the carrier substrate 160. The zoomed-in portion of FIG. 11 also illustrates that stabilization post platform 155 is wider than the stabilization post protrusion 151. In the illustrated embodiment, the stabilization post platform 155 and the stabilization post protrusion 151 are part of a monolithic portion of stabilization layer 145.

FIG. 11 also illustrates stabilization layer 145 including an array of stabilization cavities defined by cavity sidewalls 147 (which may be coated with adhesion promoter layer 144) of stabilization layer 145 that surround stabilization posts 152. In FIG. 11, the bottom surface 107 (having dimension D1) of each micro device 128 is wider that the corresponding stabilization post 152 that is directly under the micro device 128. In one embodiment (not illustrated), bottom surface 107 is wider than stabilization post protrusion 151, but not wider than stabilization post 152 as a whole. In FIG. 11, sacrificial layer 135 spans along side surfaces 106 of micro devices 128. Side surfaces 106 run between top surface 109 and a bottom surface 107 of each micro device in the array. In the illustrated embodiments, the stabilization cavity sidewalls 147 of the stabilization layer 145 are taller than the stabilization posts 152.

In the cross-sectional side view illustration of FIG. 11, patterned sacrificial spacers 137 are distributed across the illustrated structure. In some embodiments, patterned sacrificial spacers 137 are distributed throughout structure. However, in other embodiments, patterned sacrificial spacers 137 are not distributed throughout the structure, but instead they are selectively distributed.

Figure 14A:
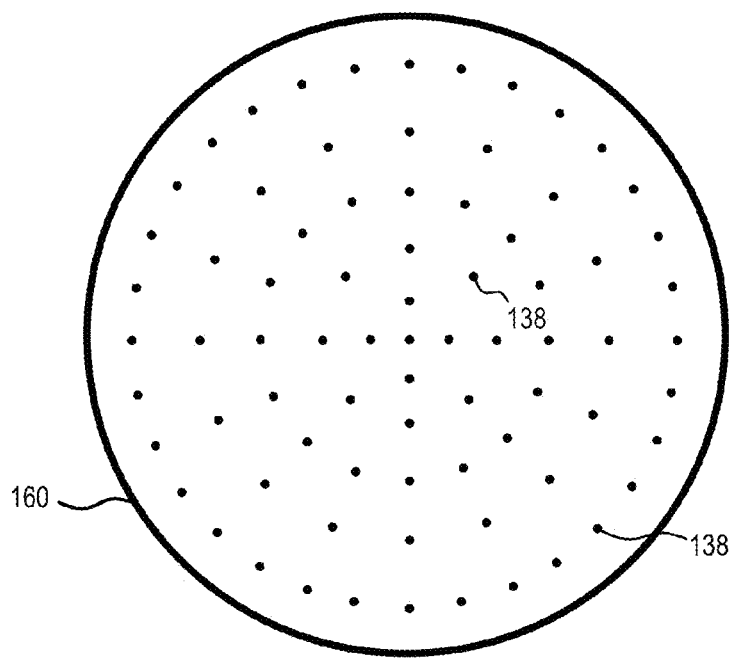
FIGS. 14A and 14B illustrate a top view of carrier substrates with example placements of groups of patterned sacrificial spacers in relation to carrier substrates in accordance with embodiments of the invention.
Figure 14B:
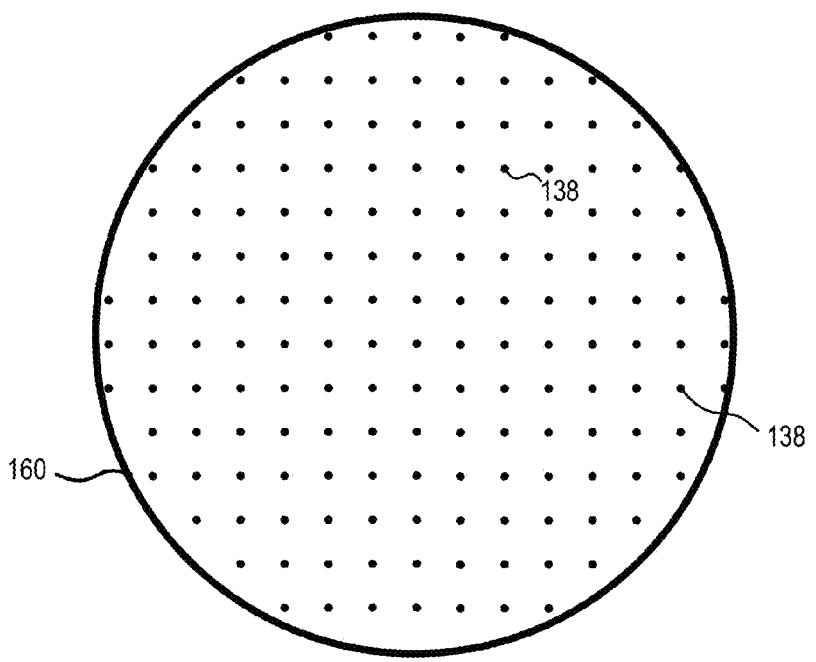

FIGS. 14A and 14B illustrate a top view of carrier substrates 160 with example placements of groups 138 of patterned sacrificial spacers 137 in relation to the carrier substrates 160 in accordance with embodiments of the invention. Carrier substrate 160 may be approximately six inches in diameter and be made of silicon. FIG. 14A shows groups 138 arranged in a pattern following concentric circles. FIG. 14B shows groups 138 arranged in a rectangular grid pattern. Of course, other configurations than those illustrated can be implemented. Additionally, although groups 138 of patterned sacrificial spacers 137 are illustrated as circular, the groups 138 of patterned sacrificial spacers 137 may also have a rectangular shape, when viewed from the view point illustrated in FIGS. 14A and 14B. In an embodiment, group 138 includes patterned sacrificial spacers 137 between an area that is five micro devices 128 wide, resulting in patterned sacrificial spacers between a total of approximately 25 micro devices 128. In an embodiment, the patterned sacrificial spacers 137 are singularly interspersed between only a small percentage (e.g. <5%) of the micro devices 128 to offset carrier substrate 160 by a standoff height during bonding.

Figure 13A:
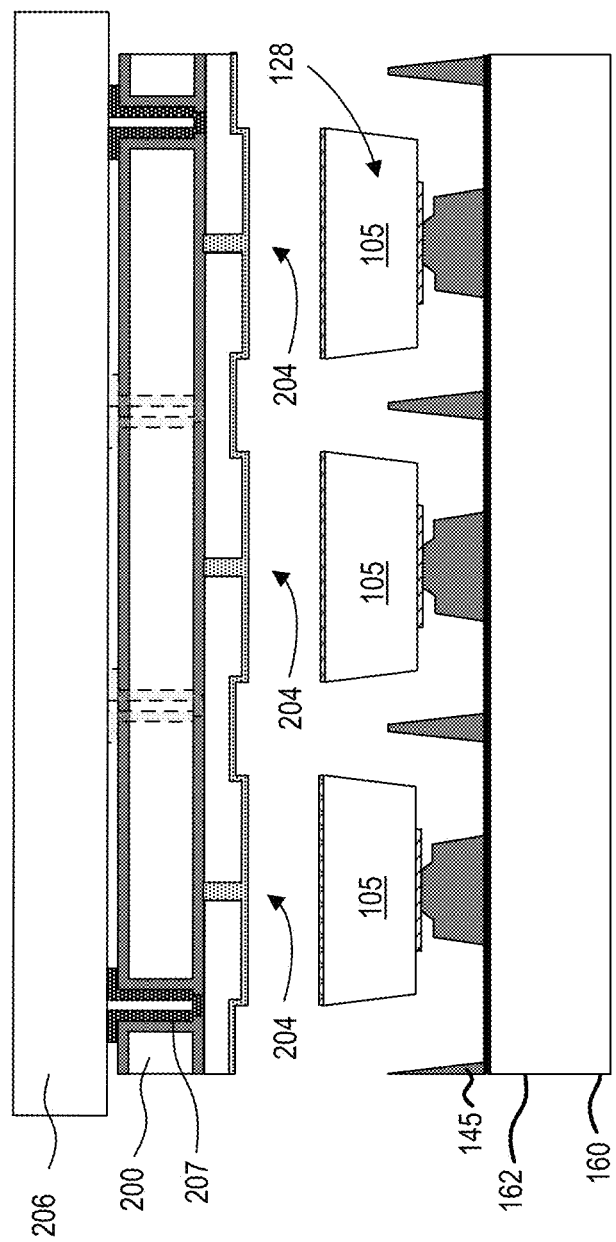
Figure 13B:
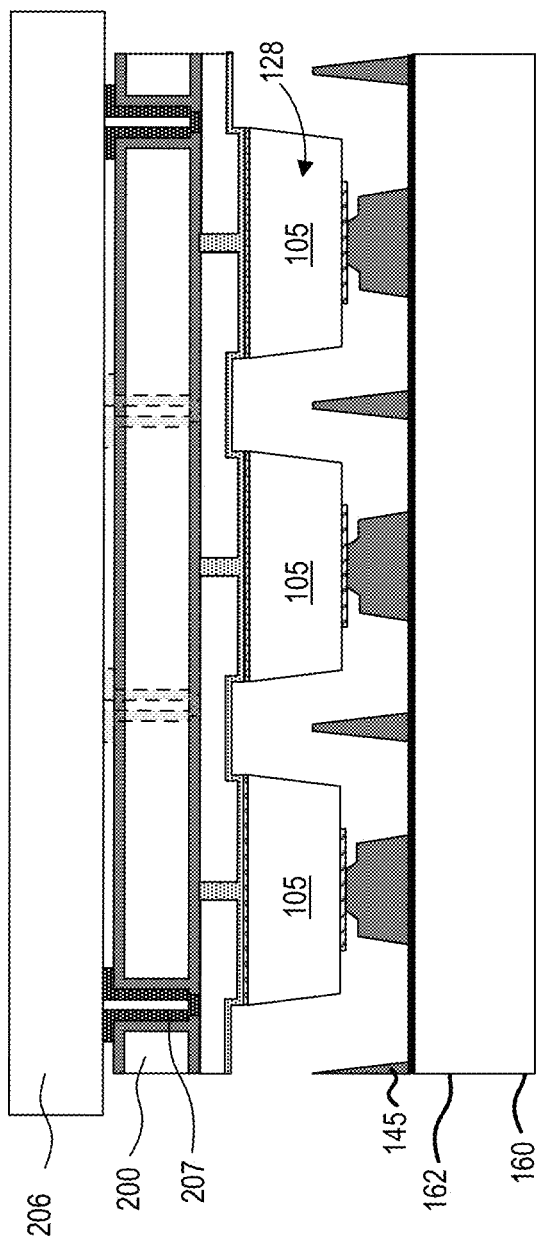
Figure 13C:
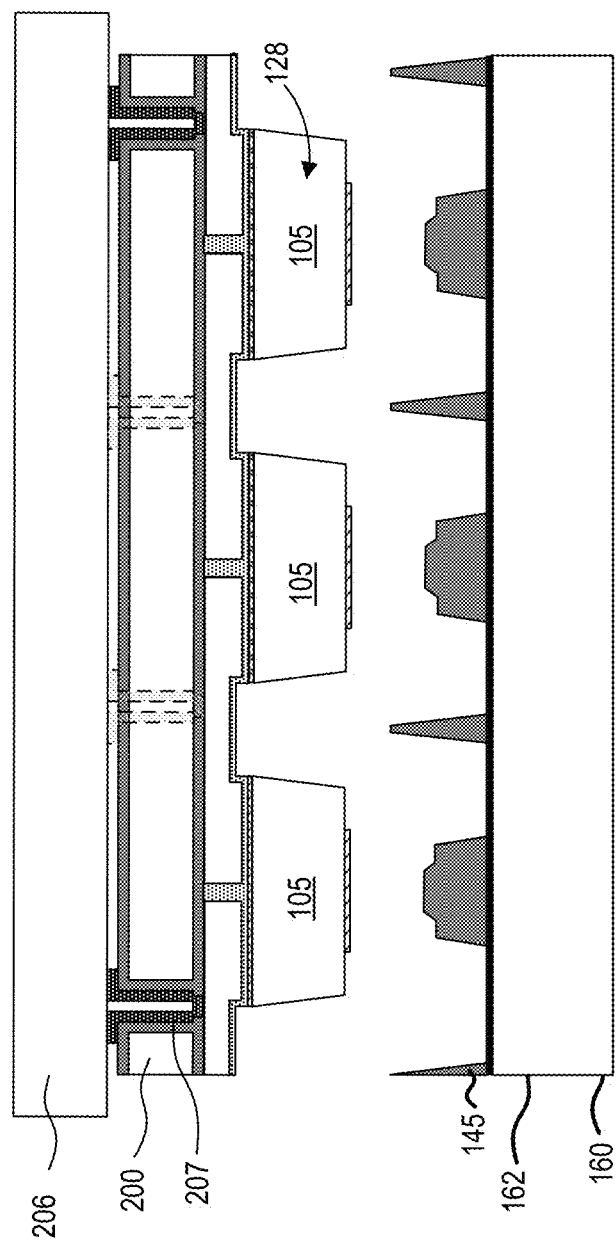
Figure 14C:
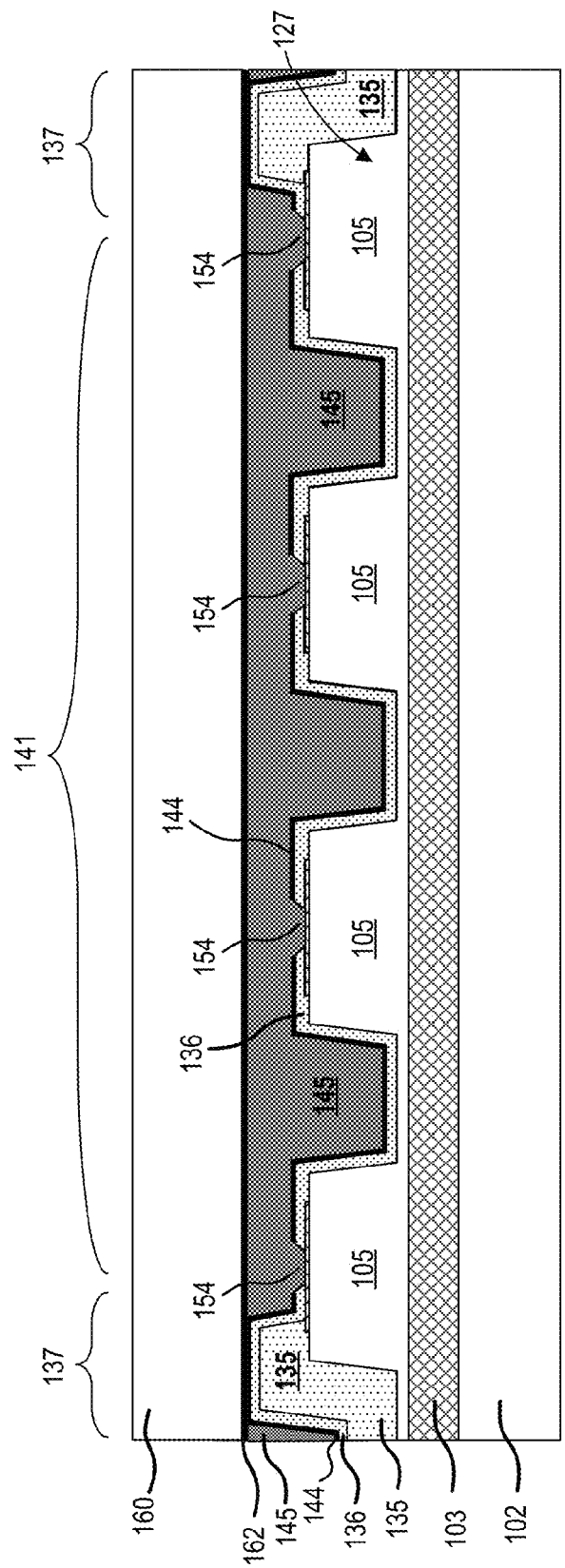
FIG. 14C is a cross-sectional side view illustration of one example of a selective distribution of patterned sacrificial spacers in accordance with an embodiment of the invention.

FIG. 14C illustrates a cross-sectional side view illustration of one example of a selective distribution of patterned sacrificial spacers 137 in accordance with an embodiment of the invention. FIG. 14C is at a similar step in the fabrication process as FIG. 8 and could be fabricated using similar processes as shown in FIGS. 2A-7. The structure of FIG. 14C could also be completed and utilized using similar processes that are described in FIGS. 9-13E with appropriate adjustments, if needed.

In FIG. 14C, a portion of a patterned sacrificial spacer 137 is illustrated on the right and left side of the illustrated structure. In contrast to FIG. 8, FIG. 14C shows that between the two partial patterned sacrificial spacers 137 is an area 141 of the structure that does not include patterned sacrificial spacers 137 for offsetting carrier substrate 160. Area 141 includes truncated stabilization posts 154 disposed between fine sacrificial layer 136. In FIG. 14C, the truncated stabilization posts 154 are in a contiguous portion of stabilization layer 145, whereas in FIG. 8, the stabilization posts 152 are isolated in non-contiguous portions of stabilization layer 145. It is appreciated that the process used to dispose fine sacrificial layer 136 in FIG. 14C may be the same as what was used to dispose fine sacrificial layer 136, as the thickness of fine sacrificial layer 136 is similar whether or not it covers course sacrificial layer 135. Since the thickness of (and patterning of) fine sacrificial layer 136 may stay the same, the size of truncated stabilization posts 154 may be the same as stabilization post protrusions 151. It is appreciated that a given structure may have an array of stabilization posts 152 (disposed as non-contiguous portions of stabilization layer 145) and an array of truncated stabilization posts 154 (disposed in contiguous portions of stabilization layer 145), in accordance with embodiments of the invention.

Figure 12A:
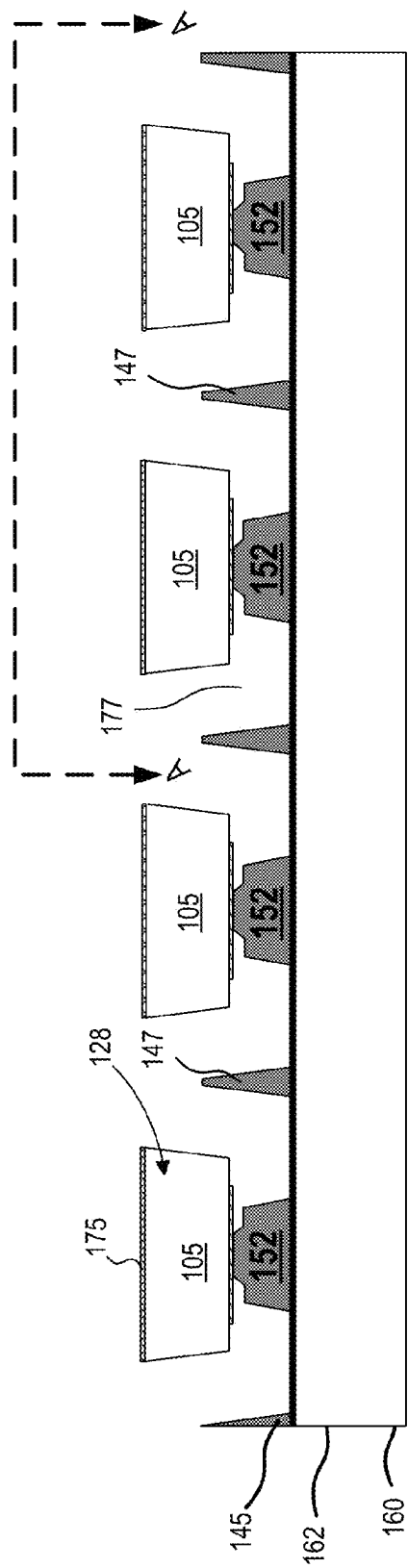
FIG. 12A is a cross-sectional side view illustration of an array of micro devices formed on an array of stabilization posts after removal of patterned sacrificial spacers in accordance with an embodiment of the invention.

Turning to FIG. 12A, FIG. 12A continues from the structure illustrated in FIG. 11. FIG. 12A is a cross-sectional side view illustration of an array of micro devices 128 formed on an array of stabilization posts 152 after removal of patterned sacrificial spacers 137 in accordance with an embodiment of the invention. In the embodiment illustrated, patterned sacrificial spacers 137 are removed resulting in an open space 177 between each micro device 128 and the features of stabilization layer 145. As illustrated, open space 177 includes the open space below each micro device 128 as well as the open space between each micro device 128 and stabilization cavity sidewalls 147 of stabilization layer 145. A suitable etching chemistry such as HF vapor, $CF_4$, or $SF_6$ plasma may be used to etch the $SiO_2$ or $SiN_x$ of the patterned sacrificial spacers 137.

After the patterned sacrificial spacers 137 are removed, the array of micro devices 128 on the array of stabilization posts 152 are supported only by the array of stabilization posts 152. At this point, the array of micro devices 128 are poised for pick up and transferring to a target or receiving substrate. After the patterned sacrificial spacers 137 are removed, it is possible that a micro device 128 may shift off of its corresponding stabilization post 152. However, in the illustrated embodiment, the stabilization cavity sidewalls 147 may be advantageously positioned to contain the shifted micro device 128 within the stabilization cavity between the cavity sidewalls 147. Therefore, even when a micro device 128 loses adherence to a stabilization post 152, it may still be poised for pick up because it is still positioned within an acceptable tolerance (defined by the stabilization cavity) to be transferred to a receiving substrate.

Figure 12B:
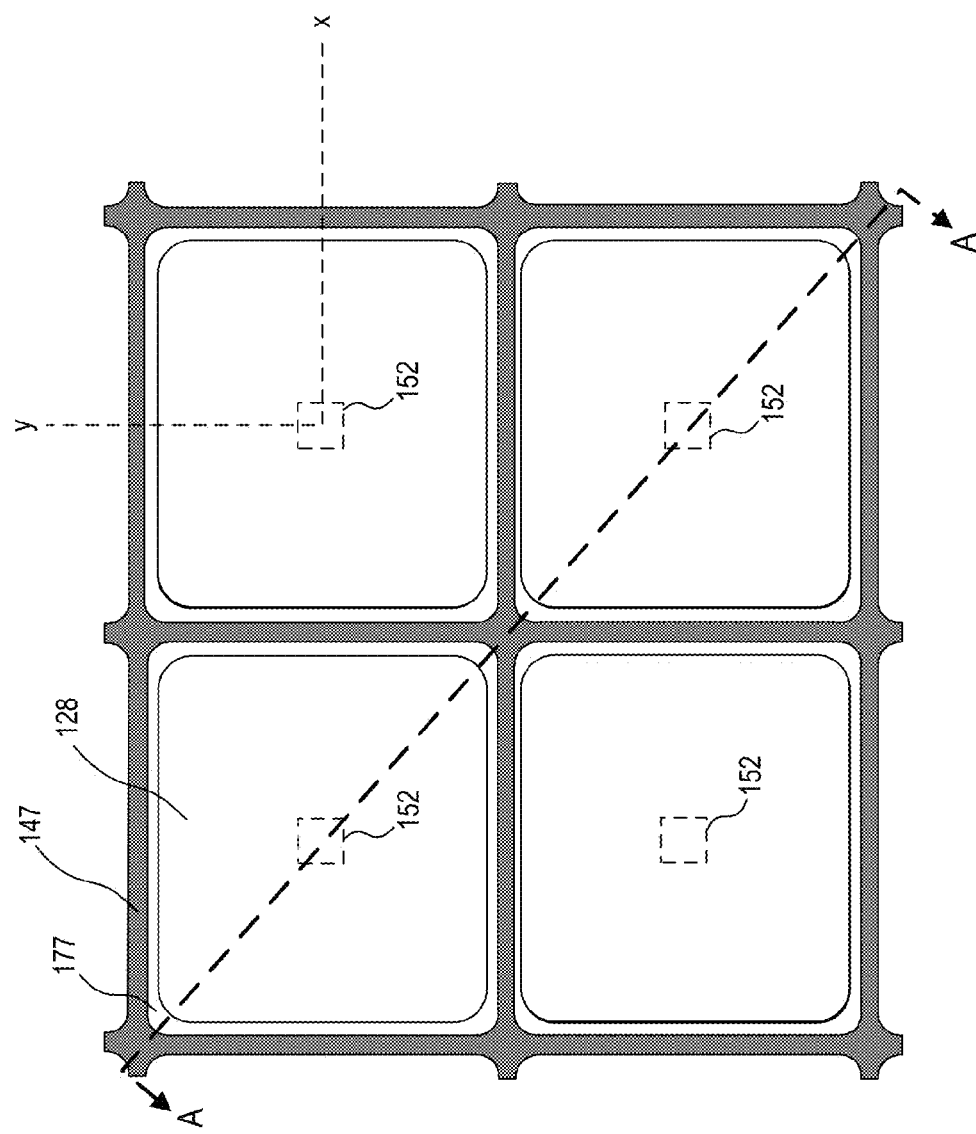
FIGS. 12B and 12C are schematic top view illustrations of example stabilization post locations relative to a group of micro devices in accordance with an embodiment of the invention.
Figure 12C:
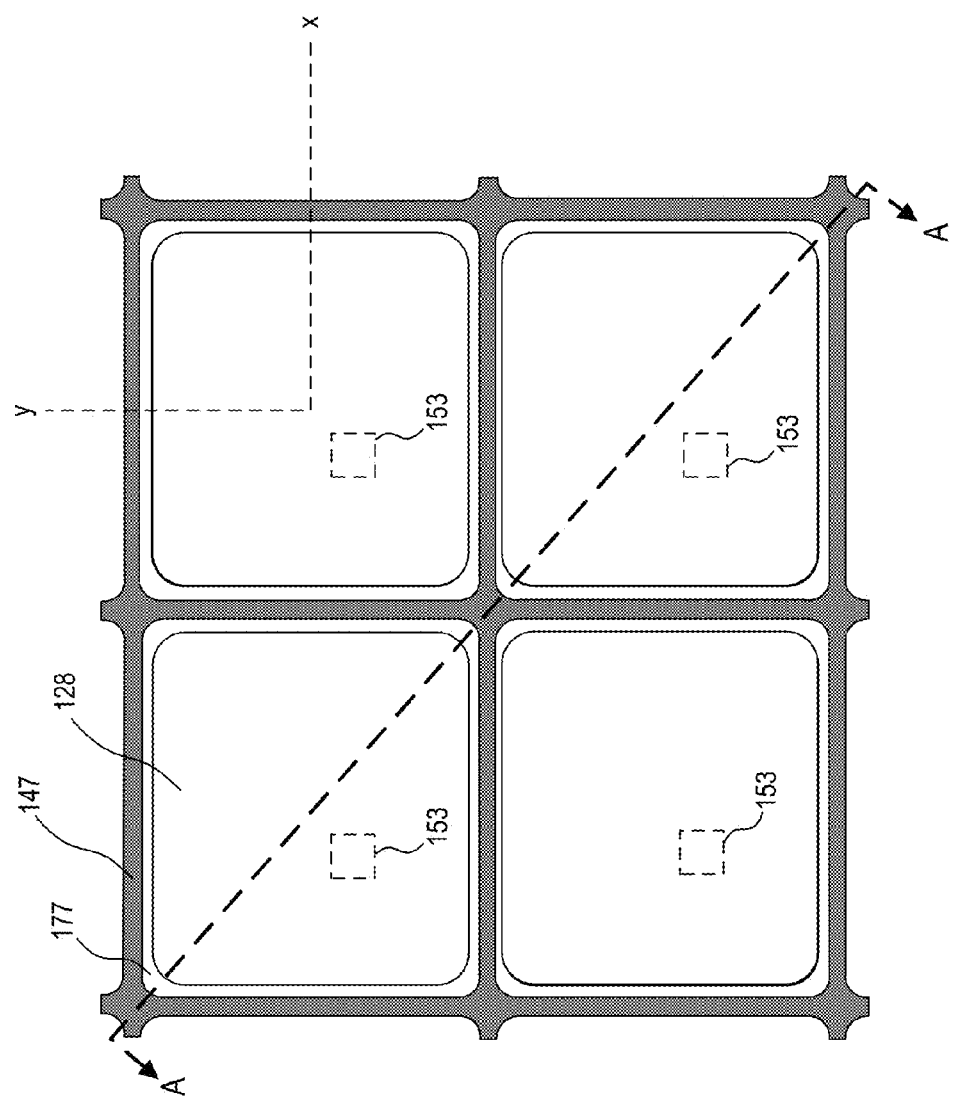

To further illustrate, FIGS. 12B and 12C are schematic top view illustrations of example stabilization post 152 locations relative to a group of micro devices 128 in accordance with an embodiment of the invention. The cross-sectional side view of FIG. 12A is illustrated along line A-A in FIGS. 12B and 12C. FIG. 12B shows an embodiment where stabilization posts 152 are centered in the x-y directions relative to a top view illustration of micro devices 128. FIG. 12B also shows how stabilization cavity sidewalls 147 can function to contain micro devices 128, if a micro device 128 loses adhesion to a stabilization post 152. FIG. 12C is substantially similar to FIG. 12B except that stabilization posts 153 have replaced stabilization posts 152. Stabilization posts 153 differ from stabilization posts 152 in that they are not centered in the x-y direction relative to a top view illustration of the micro devices 128. Of course, positions of stabilization posts other than the illustrated positions of stabilization posts 152 and 153 are possible. In an embodiment, during the pick up operation described below the off-centered stabilization posts 153 may provide for the creation of a moment when the array of transfer heads contact the array of micro devices in which the micro devices tilt slightly as a result of the applied downward pressure from the array of transfer heads. This slight tilting may aid in overcoming the adhesion strength between the stabilization posts 153 and the array of micro devices 128. Furthermore, such assistance in overcoming the adhesion strength may potentially allow for picking up the array of micro devices with a lower grip pressure. Consequently, this may allow for operation of the array of transfer heads at a lower voltage, and impose less stringent dielectric strength requirements in the dielectric layer covering each transfer head required to achieve the electrostatic grip pressure. It is appreciated that the dashed lines showing stabilization posts 152 and 153 in FIGS. 12A and 12B may illustrate stabilization posts 152 and 153 at their most narrow point, which may be at the stabilization post protrusion 151 of each stabilization post 152 as it meets conductive contact 120. Of course, truncated stabilization posts 154 may be positioned similarly to stabilization posts 152 and 153 with regard to their x-y positioning associated with a micro device that the truncated stabilization post 154 supports.

FIGS. 13A-13E are cross-sectional side view illustrations of an array of electrostatic transfer heads 204 transferring micro devices 128 from carrier substrate 160 to a receiving substrate 300 in accordance with an embodiment of the invention. FIG. 13A is a cross-sectional side view illustration of an array of micro device transfer heads 204 supported by substrate 200 and positioned over an array of micro devices 128 stabilized on stabilization posts 152 of stabilization layer 145 on carrier substrate 160. The array of micro devices 128 are then contacted with the array of transfer heads 204 as illustrated in FIG. 13B. As illustrated, the pitch of the array of transfer heads 204 is an integer multiple of the pitch of the array of micro devices 128. A voltage is applied to the array of transfer heads 204. The voltage may be applied from the working circuitry within a transfer head assembly 206 in electrical connection with the array of transfer heads through vias 207. The array of micro devices 128 is then picked up with the array of transfer heads 204 as illustrated in FIG. 13C. The array of micro devices 128 is then placed in contact with contact pads 302 (e.g. gold, indium, or tin) on a receiving substrate 300, as illustrated in FIG. 13D. The array of micro devices 128 is then released onto contact pads 302 on receiving substrate 300 as illustrated in FIG. 13E. For example, the receiving substrate may be, but is not limited to, a display substrate, a lighting substrate, a substrate with functional devices such as transistors or ICs, or a substrate with metal redistribution lines.

In accordance with embodiments of the invention, heat may be applied to the carrier substrate, transfer head assembly, or receiving substrate during the pickup, transfer, and bonding operations. For example, heat can be applied through the transfer head assembly during the pick up and transfer operations, in which the heat may or may not liquefy the micro device bonding layers 125. The transfer head assembly may additionally apply heat during the bonding operation on the receiving substrate that may or may not liquefy one of the bonding layers on the micro device or receiving substrate to cause diffusion between the bonding layers.

The operation of applying the voltage to create a grip pressure on the array of micro devices can be performed in various orders. For example, the voltage can be applied prior to contacting the array of micro devices with the array of transfer heads, while contacting the micro devices with the array of transfer heads, or after contacting the micro devices with the array of transfer heads. The voltage may also be applied prior to, while, or after applying heat to the bonding layers.

Where the transfer heads 204 include bipolar electrodes, an alternating voltage may be applied across a the pair of electrodes in each transfer head 204 so that at a particular point in time when a negative voltage is applied to one electrode, a positive voltage is applied to the other electrode in the pair, and vice versa to create the pickup pressure. Releasing the array of micro devices from the transfer heads 204 may be accomplished with a varied of methods including turning off the voltage sources, lower the voltage across the pair of silicon electrodes, changing a waveform of the AC voltage, and grounding the voltage sources.

Furthermore, the method of pickup up and transferring the array of micro devices from a carrier substrate to a receiving substrate described with regard to FIGS. 13A-13E is applicable in contexts where the micro devices are micro LEDs or other examples of micro devices described herein.

In utilizing the various aspects of this invention, it would become apparent to one skilled in the art that combinations or variations of the above embodiments are possible for stabilizing an array of micro devices on a carrier substrate, and for transferring the array of micro devices. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A stabilization structure comprising:
   a carrier substrate;
   a stabilization layer on the carrier substrate, the stabilization layer including an array of stabilization posts;
   a sacrificial layer on the stabilization layer;
   an array of micro devices over the array of stabilization posts;
   wherein the sacrificial layer includes patterned sacrificial spacers between the stabilization posts and between the micro devices; and
   wherein the stabilization layer includes contiguous portions and non-contiguous portions directly between the sacrificial layer and the carrier substrate, and the non-contiguous portions correspond to locations where the patterned sacrificial spacers extend completely through the stabilization layer.

2. The stabilization structure of claim 1, wherein the sacrificial layer includes a fine sacrificial layer and a course sacrificial layer.

3. The stabilization structure of claim 2, wherein each stabilization post in the array of stabilization posts includes a stabilization post protrusion disposed above a stabilization post platform, wherein the stabilization post platform is disposed between the stabilization post protrusion and the carrier substrate, the stabilization post protrusion extends through the fine sacrificial layer, and wherein the stabilization post platform is wider than the stabilization post protrusion, and the stabilization post platform does not extend through the fine sacrificial layer.

4. The stabilization structure of claim 1, wherein the micro devices are micro LED devices.

5. The stabilization structure of claim 1, wherein each micro device in the array of micro devices includes a bottom surface that is wider than a corresponding stabilization post directly underneath the bottom surface.

6. The stabilization structure of claim 5, wherein the stabilization posts extend through a thickness of the patterned sacrificial spacers.

7. The stabilization structure of claim 1, wherein the patterned sacrificial spacers span along a side surface of at least a portion of the micro devices in the array of micro devices.

8. The stabilization structure of claim 1, further comprising an array of bottom conductive contacts on bottom surfaces of the array of micro devices.

9. The stabilization structure of claim 1, wherein the stabilization layer includes an array of stabilization cavities that include stabilization cavity sidewalls surrounding the stabilization posts.

10. The stabilization structure of claim 1, wherein the stabilization layer is formed of a thermoset material.

11. The stabilization structure of claim 1, wherein the stabilization layer also includes truncated stabilization posts in the contiguous portions of the stabilization layer that support additional micro devices, wherein the stabilization posts in the array are in non-contiguous portions of the stabilization layer.

12. The stabilization structure of claim 1, wherein the stabilization posts in the array of stabilization posts are separated by a pitch of 1 µm to 10 µm.

13. The stabilization structure of claim 2, wherein the course sacrificial layer is thicker than the fine sacrificial layer.

14. The stabilization structure of claim 13, wherein the fine sacrificial layer spans directly underneath every micro device of the array of micro devices.

15. The stabilization structure of claim 14, wherein the coarse sacrificial layer spans directly underneath a portion of the micro devices of the array of micro devices, the portion being less than every micro device.

16. The stabilization structure of claim 15, wherein the array of stabilization posts includes a first array of truncated stabilization posts with a first post height, and a second array of stabilization posts with a second post height greater than the first post height.

17. The stabilization structure of claim 16, wherein the first array of truncated stabilization posts is in the contiguous portions of the stabilization layer.

18. The stabilization structure of claim 16, wherein the first post height is approximately the same as a thickness of the fine sacrificial layer directly underneath the array of micro devices.

19. The stabilization structure of claim 16, wherein the second post height is approximately the same as a combined thickness of the fine sacrificial layer and the coarse sacrificial layer directly underneath the array of micro devices.

* * * * *